United States Patent
Gundel

(10) Patent No.: US 9,686,893 B2
(45) Date of Patent: *Jun. 20, 2017

(54) SHIELDED ELECTRICAL CABLE

(71) Applicant: 3M INNOVATIVE PROPERTIES COMPANY, St. Paul, MN (US)

(72) Inventor: Douglas B. Gundel, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,739

(22) Filed: Aug. 12, 2014

(65) Prior Publication Data

US 2014/0345902 A1 Nov. 27, 2014

Related U.S. Application Data

(63) Continuation of application No. 13/377,864, filed as application No. PCT/US2010/038939 on Jun. 17, 2010, now Pat. No. 8,946,558.

(60) Provisional application No. 61/218,739, filed on Jun. 19, 2009, provisional application No. 61/260,881, filed on Nov. 13, 2009, provisional application No.
(Continued)

(51) Int. Cl.
| | |
|---|---|
| *H01B 7/08* | (2006.01) |
| *H05K 9/00* | (2006.01) |
| *H01B 11/20* | (2006.01) |
| *H01B 7/18* | (2006.01) |
| *H01B 11/00* | (2006.01) |
| *H01B 11/18* | (2006.01) |

(Continued)

(52) U.S. Cl.
CPC ........ *H05K 9/0098* (2013.01); *H01B 7/0823* (2013.01); *H01B 7/0838* (2013.01); *H01B 7/0861* (2013.01); *H01B 7/0876* (2013.01); *H01B 7/188* (2013.01); *H01B 11/00* (2013.01); *H01B 11/04* (2013.01); *H01B 11/10* (2013.01); *H01B 11/1091* (2013.01); *H01B 11/1891* (2013.01); *H01B 11/1895* (2013.01); *H01B 11/203* (2013.01); *H01B 7/0892* (2013.01)

(58) Field of Classification Search
None
See application file for complete search history.

(56) References Cited

U.S. PATENT DOCUMENTS

| | | |
|---|---|---|
| 2,952,728 A | 9/1960 | Yokose |
| 3,496,281 A | 2/1970 | McMahon |

(Continued)

FOREIGN PATENT DOCUMENTS

| | | |
|---|---|---|
| CN | 2615828 Y | 5/2004 |
| CN | 101127257 | 2/2008 |

(Continued)

OTHER PUBLICATIONS

International Search Report for PCT/US2010/038939, pp. 5.

*Primary Examiner* — Dion R Ferguson
(74) *Attorney, Agent, or Firm* — Robert S. Moshrefzadeh

(57) ABSTRACT

A shielded electrical cable includes a conductor set and two generally parallel shielding films disposed around the conductor set. The conductor set includes one or more substantially parallel longitudinal insulated conductors. The shielding films include a parallel portion wherein the shielding films are substantially parallel. The parallel portion is configured to electrically isolate the conductor set.

9 Claims, 29 Drawing Sheets

Related U.S. Application Data

61/348,800, filed on May 27, 2010, provisional application No. 61/352,473, filed on Jun. 8, 2010.

(51) Int. Cl.
*H01B 11/04* (2006.01)
*H01B 11/10* (2006.01)

(56) References Cited

U.S. PATENT DOCUMENTS

| | | |
|---|---|---|
| 3,735,022 A | 5/1973 | Estep |
| 3,736,366 A | 5/1973 | Wittenberg |
| 3,775,552 A | 11/1973 | Schumacher |
| 3,993,394 A | 11/1976 | Cooper |
| 4,099,323 A | 7/1978 | Bouvier |
| 4,149,026 A | 4/1979 | Fritz et al. |
| 4,185,162 A | 1/1980 | Bogese, II |
| 4,287,385 A | 9/1981 | Dombrowsky |
| 4,375,379 A | 3/1983 | Luetzow |
| 4,382,236 A | 5/1983 | Suzuki |
| 4,404,424 A | 9/1983 | King et al. |
| 4,412,092 A | 10/1983 | Hansell, III |
| 4,449,778 A | 5/1984 | Lane |
| 4,468,089 A | 8/1984 | Brorein |
| 4,470,195 A | 9/1984 | Lang |
| 4,475,006 A | 10/1984 | Olyphant, Jr. |
| 4,481,379 A | 11/1984 | Bolick et al. |
| 4,487,992 A | 12/1984 | Tomita |
| 4,490,574 A | 12/1984 | Tomita et al. |
| 4,492,815 A | 1/1985 | Maros |
| 4,611,656 A | 9/1986 | Kendall et al. |
| 4,616,717 A | 10/1986 | Luetzow |
| 4,705,332 A | 11/1987 | Sadigh-Behzadi |
| 4,720,155 A | 1/1988 | Schildkraut et al. |
| 4,735,583 A | 4/1988 | Rudy, Jr. et al. |
| 4,767,345 A | 8/1988 | Gutter et al. |
| 4,780,157 A | 10/1988 | Coon |
| 4,800,236 A | 1/1989 | Lemke |
| 4,850,898 A | 7/1989 | Gallusser |
| 4,920,234 A | 4/1990 | Lemke |
| 5,003,126 A | 3/1991 | Fujii et al. |
| 5,057,646 A | 10/1991 | Nichols et al. |
| 5,084,594 A | 1/1992 | Cady et al. |
| 5,090,911 A | 2/1992 | Welsh |
| 5,097,099 A | 3/1992 | Miller |
| 5,132,489 A | 7/1992 | Yamano |
| 5,162,611 A | 11/1992 | Nichols, III et al. |
| 5,171,161 A | 12/1992 | Kachlic |
| 5,184,965 A | 2/1993 | Myschik et al. |
| 5,235,132 A | 8/1993 | Ainsworth et al. |
| 5,244,415 A | 9/1993 | Marsilio et al. |
| 5,250,127 A | 10/1993 | Hara |
| 5,268,531 A | 12/1993 | Nguyen et al. |
| 5,279,415 A | 1/1994 | Edgley et al. |
| 5,286,924 A | 2/1994 | Loder et al. |
| 5,380,216 A | 1/1995 | Broeksteeg et al. |
| 5,428,189 A | 6/1995 | Dorner et al. |
| 5,441,424 A | 8/1995 | Morlion et al. |
| 5,446,239 A | 8/1995 | Mizutani et al. |
| 5,460,533 A | 10/1995 | Broeksteeg et al. |
| 5,463,186 A | 10/1995 | Schricker |
| 5,477,159 A | 12/1995 | Hamling |
| 5,483,020 A | 1/1996 | Hardie et al. |
| 5,507,653 A | 4/1996 | Stoner |
| 5,511,992 A | 4/1996 | Thalhammer |
| 5,518,421 A | 5/1996 | Davis |
| 5,524,766 A | 6/1996 | Marchek et al. |
| 5,600,544 A | 2/1997 | Thalhammer |
| 5,632,634 A | 5/1997 | Soes |
| 5,702,258 A | 12/1997 | Provencher et al. |
| 5,743,765 A | 4/1998 | Andrews et al. |
| 5,766,036 A | 6/1998 | Ahmad et al. |
| 5,767,442 A | 6/1998 | Eisenberg et al. |
| 5,775,924 A | 7/1998 | Miskin et al. |
| 5,804,768 A | 9/1998 | Sexton |
| 5,900,588 A | 5/1999 | Springer et al. |
| 5,934,942 A | 8/1999 | Patel et al. |
| 5,938,476 A | 8/1999 | Wu et al. |
| 5,941,733 A | 8/1999 | Lai |
| 6,007,385 A | 12/1999 | Wu |
| 6,039,606 A | 3/2000 | Chiou |
| 6,043,434 A | 3/2000 | Prudhon |
| 6,089,916 A | 7/2000 | Kuo |
| 6,288,340 B1 | 9/2001 | Arnould |
| 6,367,128 B1 | 4/2002 | Galkiewicz et al. |
| 6,392,155 B1 | 5/2002 | Shimizu et al. |
| 6,524,135 B1 | 2/2003 | Feldman et al. |
| 6,546,604 B2 | 4/2003 | Galkiewicz et al. |
| 6,588,074 B2 | 7/2003 | Galkiewicz et al. |
| 6,717,058 B2 | 4/2004 | Booth et al. |
| 6,763,556 B2 | 7/2004 | Fagan et al. |
| 6,831,230 B2 | 12/2004 | Ide et al. |
| 7,196,273 B2 | 3/2007 | Tanaka et al. |
| 7,267,575 B1 | 9/2007 | Hwang |
| 7,329,141 B2 | 2/2008 | Kumakura et al. |
| 7,807,927 B2 | 10/2010 | Yeh |
| 8,013,249 B2 | 9/2011 | Watanabe et al. |
| 8,113,273 B2 | 2/2012 | Manke et al. |
| 8,946,558 B2 * | 2/2015 | Gundel ............... H01B 7/0861 174/110 R |
| 2002/0020545 A1 | 2/2002 | Suzuki |
| 2003/0085052 A1 | 5/2003 | Tsao et al. |
| 2003/0102148 A1 | 6/2003 | Ohara et al. |
| 2003/0213610 A1 | 11/2003 | Ide et al. |
| 2006/0016615 A1 | 1/2006 | Schilson et al. |
| 2006/0054334 A1 | 3/2006 | Vaupotic et al. |
| 2006/0131058 A1 | 6/2006 | Lique et al. |
| 2006/0172588 A1 | 8/2006 | Peng |
| 2006/0207784 A1 | 9/2006 | Chang |
| 2007/0240896 A1 | 10/2007 | Ott et al. |
| 2010/0186225 A1 | 7/2010 | Reichert et al. |

FOREIGN PATENT DOCUMENTS

| | | |
|---|---|---|
| CN | 101673597 | 3/2010 |
| DE | 911 277 | 9/1954 |
| DE | 25 47 152 | 4/1977 |
| DE | 26 44 252 | 3/1978 |
| DE | 27 58 472 | 7/1979 |
| DE | 35 22 173 C1 | 7/1986 |
| EP | 0 082 700 | 6/1983 |
| EP | 0 103 430 | 3/1984 |
| EP | 0 136 040 | 4/1985 |
| EP | 0 284 245 | 9/1988 |
| EP | 0 446 980 A1 | 9/1991 |
| EP | 0 477 006 A1 | 3/1992 |
| EP | 0 548 942 A1 | 6/1993 |
| EP | 0 654 859 A1 | 5/1995 |
| EP | 0 696 085 A2 | 2/1996 |
| EP | 0 907 221 A2 | 4/1999 |
| EP | 0 961 298 A1 | 12/1999 |
| GB | 1 546 609 | 5/1979 |
| JP | S42-4625 | 2/1967 |
| JP | S50-13167 | 2/1975 |
| JP | 60-140309 | 9/1985 |
| JP | 60-166919 | 11/1985 |
| JP | 61-133914 | 8/1986 |
| JP | S61-292814 | 12/1986 |
| JP | S62-226508 | 10/1987 |
| JP | 63-172012 | 11/1988 |
| JP | 10-23947 | 1/1989 |
| JP | 03-10425 | 1/1991 |
| JP | 4-36906 | 2/1992 |
| JP | H06-5042 | 1/1994 |
| JP | 06-33318 | 4/1994 |
| JP | H07-296645 | 11/1995 |
| JP | 8-106818 | 4/1996 |
| JP | 8-203350 | 8/1996 |
| JP | 1998-223056 | 8/1998 |
| JP | 2000082346 | 3/2000 |
| JP | 2001135157 | 5/2001 |
| JP | 2002-117731 | 4/2002 |
| JP | 2002-208320 | 7/2002 |
| JP | 2003045240 | 2/2003 |

(56) References Cited

FOREIGN PATENT DOCUMENTS

| | | |
|---|---|---|
| JP | 2003281944 | 10/2003 |
| JP | 2005-108754 | 4/2005 |
| JP | 2005-116300 | 4/2005 |
| JP | 2006-286480 | 10/2006 |
| JP | 2007265640 | 10/2007 |
| JP | 4164979 | 10/2008 |
| JP | 2009093934 | 4/2009 |
| JP | 2009-099349 | 5/2009 |
| JP | 2010-097882 | 4/2010 |
| WO | WO 2006/113702 A1 | 10/2006 |
| WO | WO 2009/130859 A1 | 10/2009 |

* cited by examiner

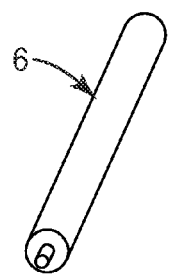
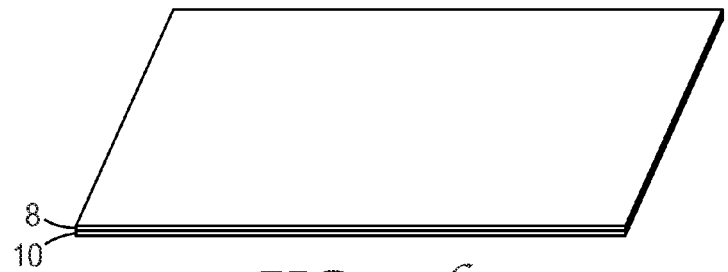
FIG. 10a
FIG. 10b
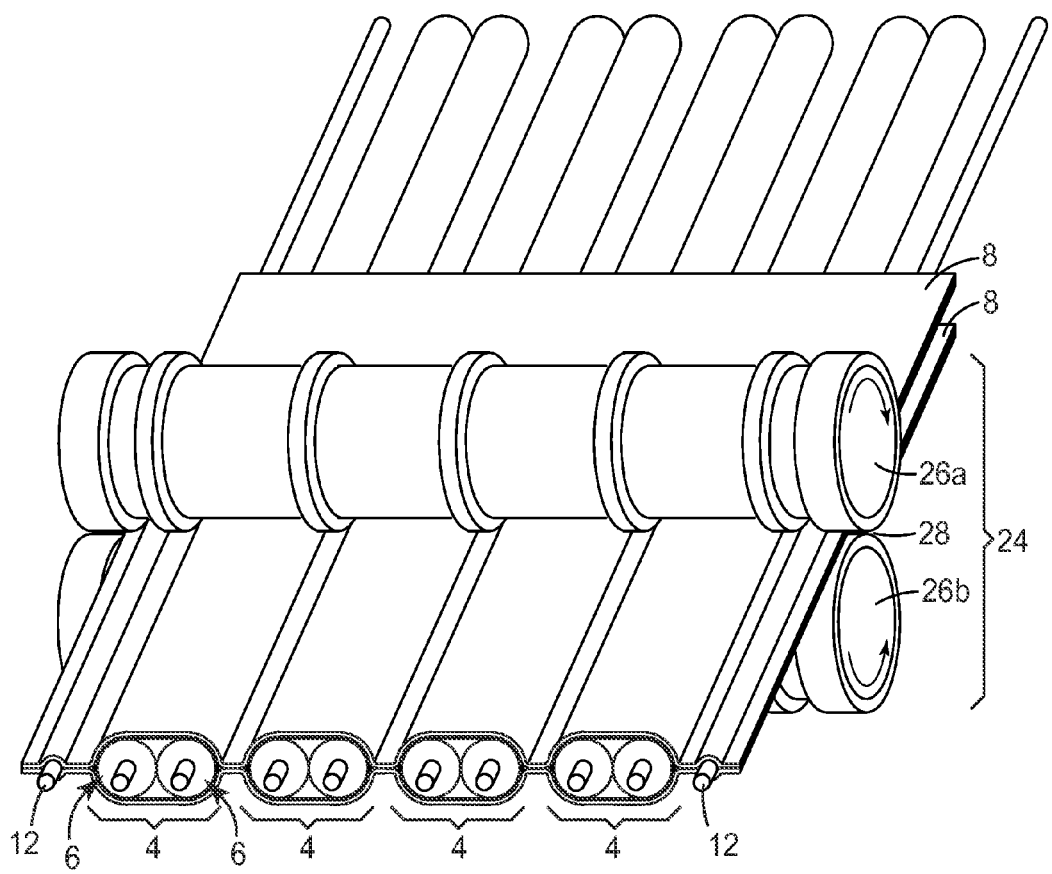
FIG. 10c

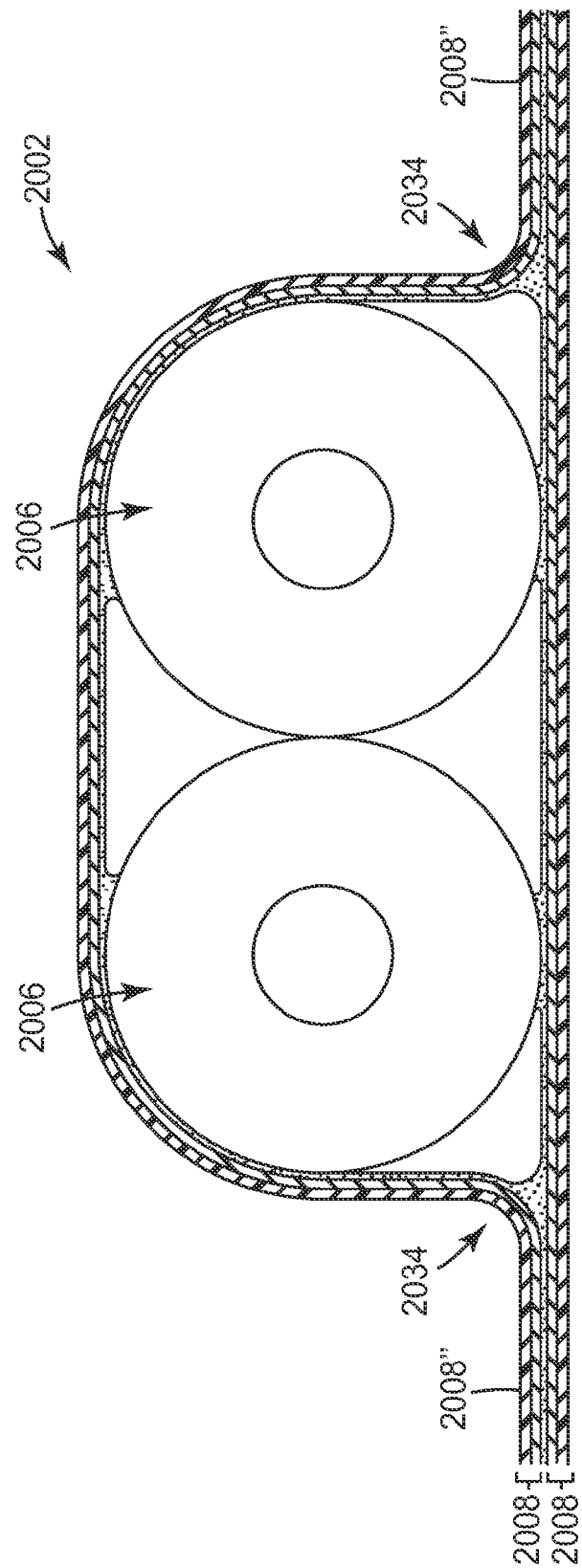

SHIELDED ELECTRICAL CABLE

TECHNICAL FIELD

The present disclosure relates generally to shielded electrical cables for the transmission of electrical signals. In particular, the present invention relates to shielded electrical cables that can be mass-terminated and provide high speed electrical properties.

BACKGROUND

Electrical cables for transmission of electrical signals are well known. One common type of electrical cable is a coaxial cable. Coaxial cables generally include an electrically conductive wire surrounded by an insulator. The wire and insulator are surrounded by a shield, and the wire, insulator, and shield are surrounded by a jacket. Another common type of electrical cable is a shielded electrical cable comprising one or more insulated signal conductors surrounded by a shielding layer formed, for example, by a metal foil. To facilitate electrical connection of the shielding layer, a further un-insulated conductor is sometimes provided between the shielding layer and the insulation of the signal conductor or conductors. Both these common types of electrical cable normally require the use of specifically designed connectors for termination and are often not suitable for the use of mass-termination techniques, i.e., the simultaneous connection of a plurality of conductors to individual contact elements, such as, e.g., electrical contacts of an electrical connector or contact elements on a printed circuit board. Although electrical cables have been developed to facilitate these mass-termination techniques, these cables often have limitations in the ability to mass-produce them, in the ability to prepare their termination ends, in their flexibility, and in their electrical performance. In view of the advancements in high speed electrical and electronic components, a continuing need exists for electrical cables that are capable of transmitting high speed signals, facilitate mass-termination techniques, are cost-effective, and can be used in a large number of applications.

SUMMARY

In one aspect, the present invention provides a shielded electrical cable including a conductor set and two generally parallel shielding films disposed around the conductor set. The conductor set includes one or more substantially parallel longitudinal insulated conductors. The shielding films include a parallel portion wherein the shielding films are substantially parallel. The parallel portion is configured to electrically isolate the conductor set.

In another aspect, the present invention provides a shielded electrical cable including at least two spaced apart conductor sets arranged generally in a single plane and two generally parallel shielding films disposed around the conductor sets. Each conductor set includes one or more substantially parallel longitudinal insulated conductors. The shielding films include a parallel portion wherein the shielding films are substantially parallel. The parallel portion is configured to electrically isolate adjacent conductor sets from each other.

In another aspect, the present invention provides a shielded electrical cable including at least one longitudinal ground conductor, an electrical article extending in substantially the same direction as the ground conductor, and two generally parallel shielding films disposed around the ground conductor and the electrical article.

In another aspect, the present invention provides a shielded electrical cable including two spaced apart substantially parallel longitudinal ground conductors, an electrical article positioned between and extending in substantially the same direction as the ground conductors, and two generally parallel shielding films disposed around the ground conductors and the electrical article.

The above summary of the present invention is not intended to describe each disclosed embodiment or every implementation of the present invention. The Figures and detailed description that follow below more particularly exemplify illustrative embodiments.

BRIEF DESCRIPTION OF THE DRAWINGS

FIGS. 10a-10e and 10f-10g are perspective and front cross-sectional views, respectively, illustrating an exemplary method of making a shielded electrical cable according to an aspect of the present invention.

FIGS. 14a-14b are front cross-sectional views of two other exemplary embodiments of a shielded electrical cable according to an aspect of the present invention.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized, and structural or logical changes may be made without departing from the scope of the present invention. The following detailed description, therefore, is not to be taken in a limiting sense, and the scope of the invention is defined by the appended claims.

Figure 1:
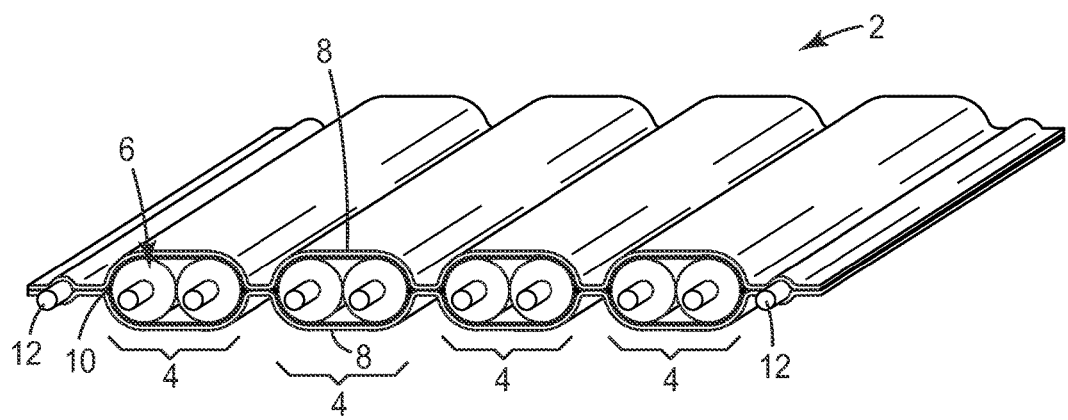
FIG. 1 is a perspective view of an exemplary embodiment of a shielded electrical cable according to an aspect of the present invention.

Referring now to the Figures, FIG. 1 illustrates an exemplary embodiment of a shielded electrical cable according to an aspect of the present invention. Shielded electrical cable 2 includes a plurality of spaced apart conductor sets 4 arranged generally in a single plane. Each conductor set includes two substantially parallel longitudinal insulated conductors 6. Insulated conductors 6 may include insulated signal wires, insulated power wires, or insulated ground wires. Two generally parallel shielding films 8 are disposed around conductor sets 4. A conformable adhesive layer 10 is disposed between shielding films 8 and bonds shielding films 8 to each other on both sides of each conductor set 4. In one embodiment, conductor sets 4 have a substantially curvilinear cross-sectional shape, and shielding films 8 are disposed around conductor sets 4 such as to substantially conform to and maintain the cross-sectional shape. Maintaining the cross-sectional shape maintains the electrical characteristics of conductor sets 4 as intended in the design of conductor sets 4. This is an advantage over some conventional shielded electrical cables where disposing a conductive shield around a conductor set changes the cross-sectional shape of the conductor set.

Although in the embodiment illustrated in FIG. 1, each conductor set 4 includes two insulated conductors 6, in other embodiments, each conductor set 4 may include one or more insulated conductors 6. For example, instead of shielded electrical cable 2 including four conductor sets 4 each including two insulated conductors 6 as shown in FIG. 1, shielded electrical cable 2 may include one conductor set 4 including eight insulated conductors 6, or eight conductor sets 4 each including one insulated conductor 6. This flexibility in arrangements of conductor sets 4 and insulated conductors 6 allows shielded electrical cable 2 to be configured suitable for the intended application. For example, conductor sets 4 and insulated conductors 6 may be configured to form a multiple twinaxial cable, i.e., multiple conductor sets 4 each including two insulated conductors 6, a multiple coaxial cable, i.e., multiple conductor sets each including one insulated conductor 6, or a combination thereof. In other embodiments, a conductor set 4 may further include a conductive shield (not shown) disposed around the one or more insulated conductors 6, and an insulative jacket (not shown) disposed around the conductive shield.

In the embodiment illustrated in FIG. 1, shielded electrical cable 2 further includes optional longitudinal ground conductors 12. Ground conductors 12 may include ground wires or drain wires. Ground conductors 12 are spaced apart from and extend in substantially the same direction as insulated conductors 6. Conductor sets 4 and ground conductors 12 are arranged generally in a single plane. Shielding films 8 are disposed around ground conductors 12 and conformable adhesive layer 10 bonds shielding films 8 to each other on both sides of ground conductors 12. Ground conductors 12 may electrically contact at least one of shielding films 8.

FIGS. 2a-2e illustrate various exemplary embodiments of a shielded electrical cable according to aspects of the present invention. FIGS. 2a-2e are specifically intended to illustrate various examples of arrangements of conductors disposed between two shielding films.

Figure 2A:
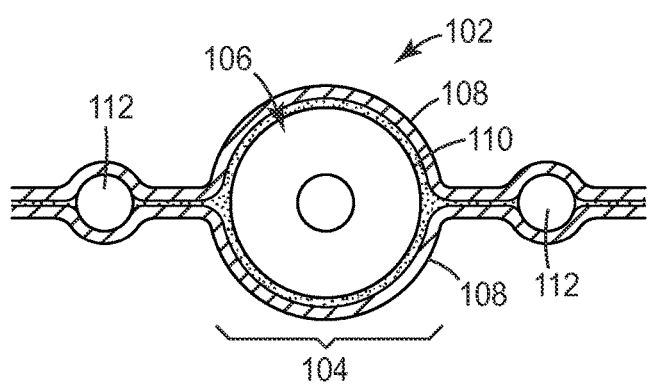
FIGS. 2a-2e are front cross-sectional views of five other exemplary embodiments of a shielded electrical cable according to aspects of the present invention.

Referring to FIG. 2a, shielded electrical cable 102 includes a single conductor set 104. Conductor set 104 includes a single longitudinal insulated conductor 106. Two generally parallel shielding films 108 are disposed around conductor set 104. A conformable adhesive layer 110 is disposed between shielding films 108 and bonds shielding films 108 to each other on both sides of conductor set 104. Shielded electrical cable 102 further includes optional longitudinal ground conductors 112. Ground conductors 112 are spaced apart from and extend in substantially the same direction as insulated conductor 106. Conductor set 104 and ground conductors 112 are arranged generally in a single plane. Shielding films 108 are disposed around ground conductors 112 and conformable adhesive layer 110 bonds shielding films 108 to each other on both sides of ground conductors 112. Ground conductors 112 may electrically contact at least one of shielding films 108. Insulated conductor 106 is effectively arranged in a coaxial or single ended cable arrangement.

Figure 2B:
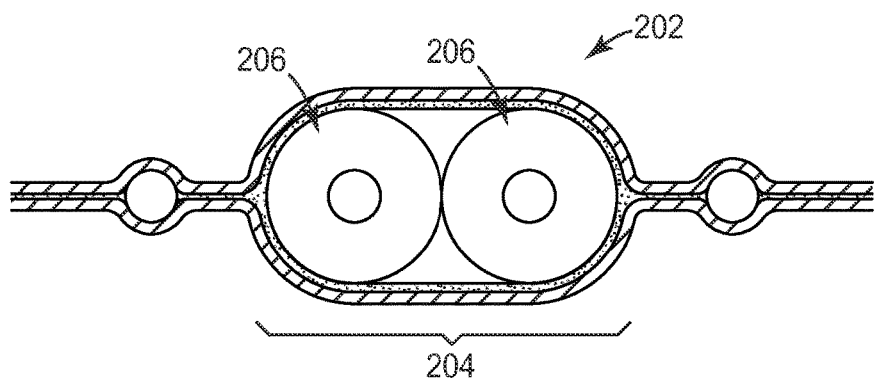

Referring to FIG. 2b, shielded electrical cable 202 is similar to shielded electrical cable 102 illustrated in FIG. 2a. Where shielded electrical cable 102 includes a single conductor set 104 including a single longitudinal insulated conductor 106, shielded electrical cable 202 includes a single conductor set 204 including two substantially parallel longitudinal insulated conductors 206. Insulated conductors 206 are arranged generally in a single plane and effectively in a twinaxial or differential pair cable arrangement.

Figure 2C:
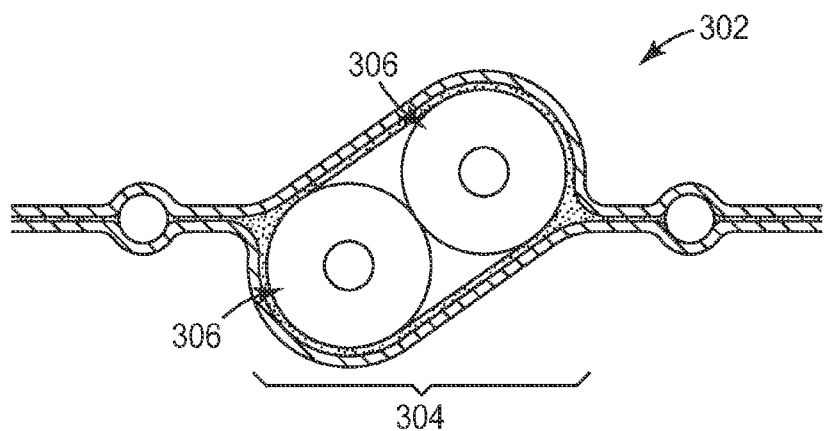

Referring to FIG. 2c, shielded electrical cable 302 is similar to shielded electrical cable 102 illustrated in FIG. 2a. Where shielded electrical cable 102 includes a single conductor set 104 including a single longitudinal insulated conductor 106, shielded electrical cable 302 includes a single conductor set 304 including two longitudinal insulated conductors 306. Insulated conductors 306 are arranged effectively in a twisted pair cable arrangement, whereby insulated conductors 306 twist around each other in longitudinal direction.

Figure 2D:
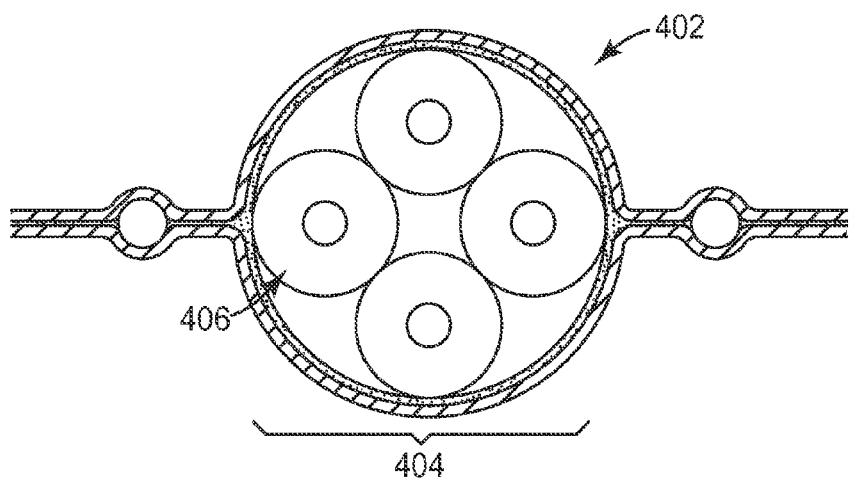

Referring to FIG. 2d, shielded electrical cable 402 is similar to shielded electrical cable 102 illustrated in FIG. 2a. Where shielded electrical cable 102 includes a single conductor set 104 including a single longitudinal insulated conductor 106, shielded electrical cable 402 includes a single conductor set 404 including four longitudinal insulated conductors 406. Insulated conductors 406 are arranged effectively in a quad cable arrangement, whereby insulated conductors 406 may twist around each other in longitudinal direction, or may be substantially parallel.

Figure 2E:
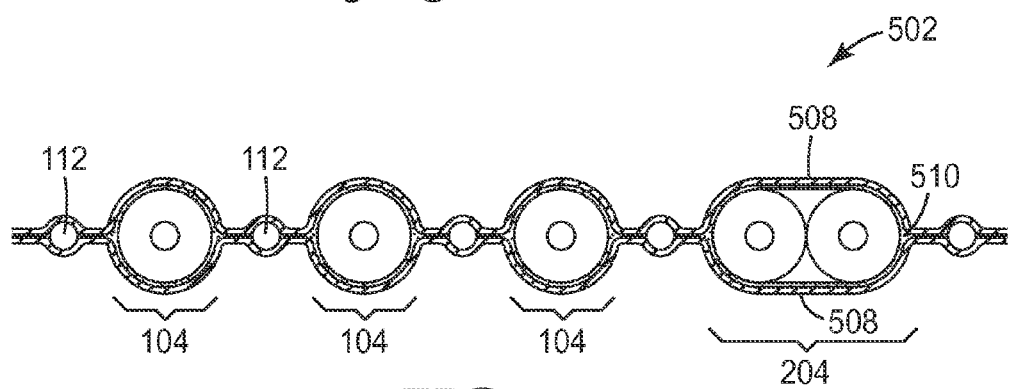

Referring back to FIGS. 2a-2d, further embodiments of shielded electrical cables according to aspects of the present invention may include a plurality of spaced apart conductor sets 104, 204, 304 or 404, or combinations thereof, arranged generally in a single plane. Optionally, the shielded electrical cables may include a plurality of ground conductors 112 spaced apart from and extending generally in the same direction as the insulated conductors of the conductor sets, wherein the conductor sets and ground conductors are arranged generally in a single plane. FIG. 2e illustrates an exemplary embodiment of such a shielded electrical cable.

Referring to FIG. 2e, shielded electrical cable 502 includes a plurality of spaced apart conductor sets 104, 204 arranged generally in a single plane. Shielded electrical cable 502 further includes optional ground conductors 112 disposed between conductor sets 104, 204 and at both ends of shielded electrical cable 502. Two generally parallel shielding films 508 are disposed around conductor sets 104, 204 and ground conductors 112. A conformable adhesive layer 510 is disposed between shielding films 508 and bonds shielding films 508 to each other on both sides of each conductor set 104, 204 and each ground conductor. Shielded electrical cable 502 includes a combination of coaxial cable arrangements (conductor sets 104) and a twinaxial cable arrangement (conductor set 204) and may therefore be referred to as a hybrid cable arrangement.

Figure 3:
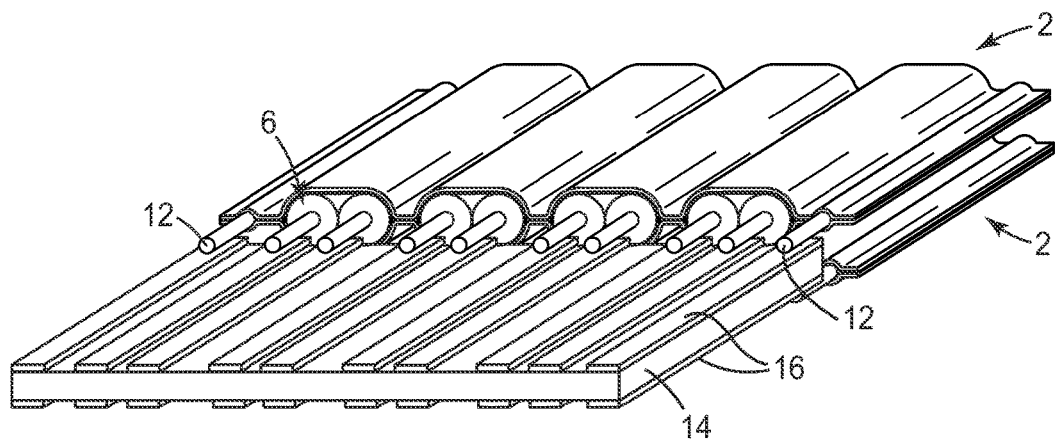
FIG. 3 is a perspective view of two shielded electrical cables of FIG. 1 terminated to a printed circuit board.

FIG. 3 illustrates two shielded electrical cables 2 terminated to a printed circuit board 14. Because insulated conductors 6 and ground conductors 12 are arranged generally in a single plane, shielded electrical cables 2 are well suited for mass-stripping, i.e., the simultaneous stripping of shielding films 8 and insulated conductors 6, and mass-termination, i.e., the simultaneous terminating of the stripped ends of insulated conductors 6 and ground conductors 12, which allows a more automated cable assembly process. This is an advantage of the shielded electrical cables according to aspects of the present invention. In FIG. 3, the stripped ends of insulated conductors 6 and ground conductors 12 are terminated to contact elements 16 on printed circuit board 14. In other embodiments, the stripped ends of insulated conductors 6 and ground conductors 12 may be terminated to any suitable individual contact elements of any suitable termination point, such as, e.g., electrical contacts of an electrical connector.

FIGS. 4a-4d illustrate an exemplary termination process of shielded electrical cable 2 to printed circuit board 14. This termination process can be a mass-termination process and includes the steps of stripping (illustrated in FIGS. 4a-4b), aligning (illustrated in FIG. 4c), and terminating (illustrated in FIG. 4d). When forming shielded electrical cable 2, the arrangement of conductor sets 4, insulated conductors 6, and ground conductors 12 of shielded electrical cable 2 may be matched to the arrangement of contact elements 16 on printed circuit board 14, which would eliminate any significant manipulation of the end portions of shielded electrical cable 2 during alignment or termination.

Figure 4A:
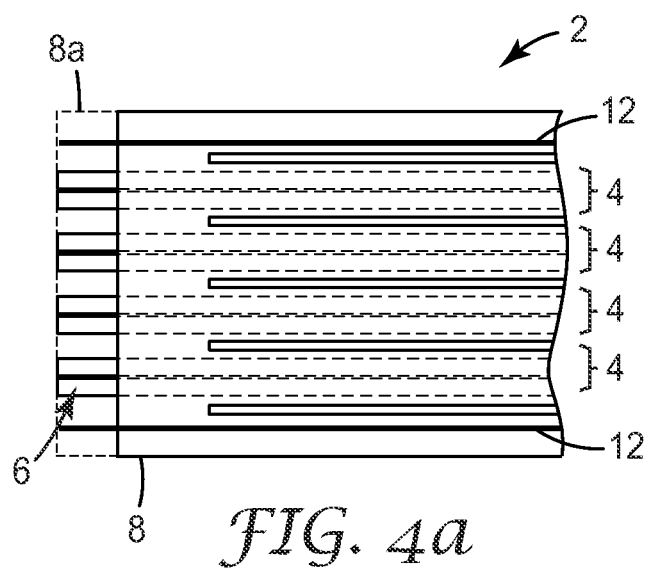
FIGS. 4a-4d are top views of an exemplary termination process of a shielded electrical cable according to an aspect of the present invention.
Figure 4B:
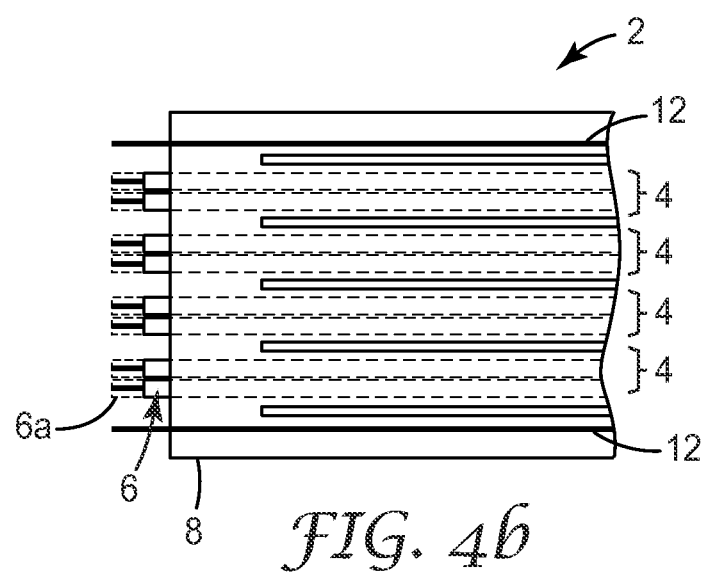
Figure 4C:
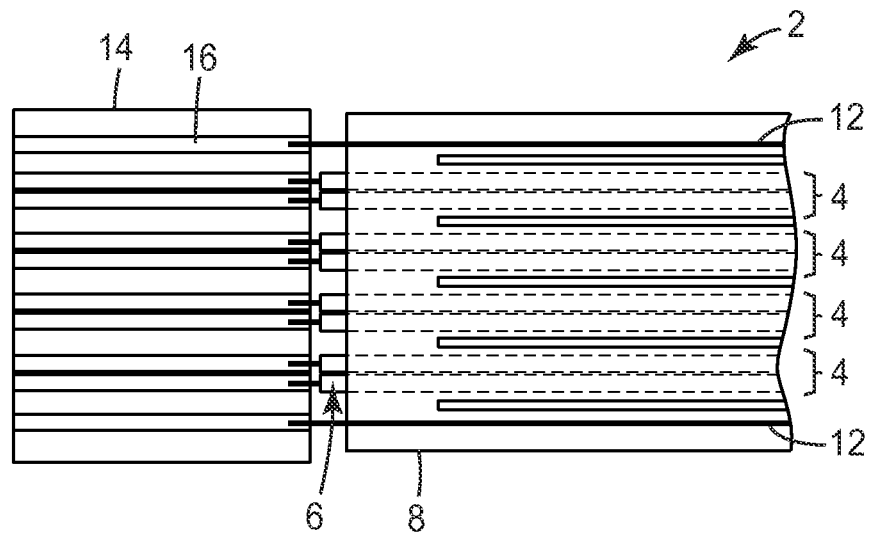
Figure 4D:
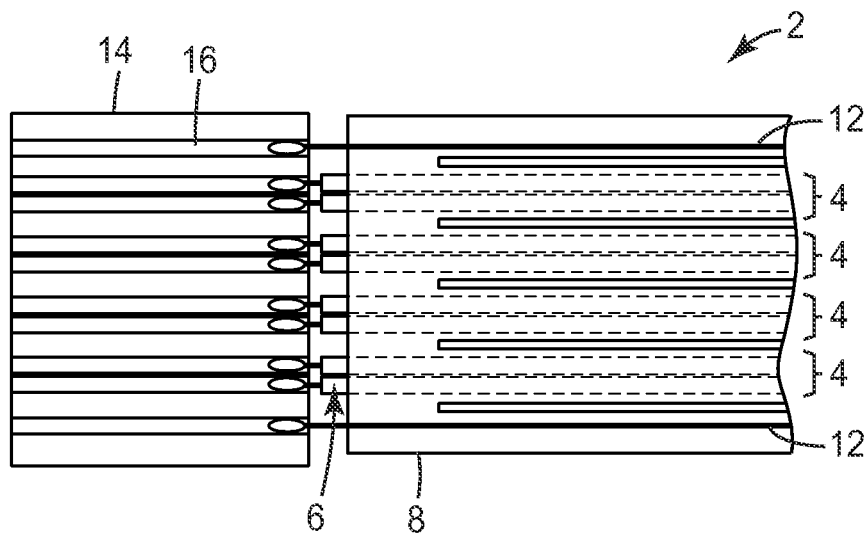

In the step illustrated in FIG. 4a, an end portion 8a of shielding films 8 is removed. Any suitable method may be used, such as, e.g., mechanical stripping or laser stripping. This step exposes an end portion of insulated conductors 6 and ground conductors 12. In one aspect, mass-stripping of end portion 8a of shielding films 8 is possible because they form an integrally connected layer that is separate from the insulation of insulated conductors 6. Removing shielding films 8 from insulated conductors 6 allows protection against electrical shorting at these locations and also provides independent movement of the exposed end portions of insulated conductors 6 and ground conductors 12. In the step illustrated in FIG. 4b, an end portion 6a of the insulation of insulated conductors 6 is removed. Any suitable method may be used, such as, e.g., mechanical stripping or laser stripping. This step exposes an end portion of the conductor of insulated conductors 6. In the step illustrated in FIG. 4c, shielded electrical cable 2 is aligned with printed circuit board 14 such that the end portions of the conductors of insulated conductors 6 and the end portions of ground conductors 12 of shielded electrical cable 2 are aligned with contact elements 16 on printed circuit board 14. In the step illustrated in FIG. 4d, the end portions of the conductors of insulated conductors 6 and the end portions of ground conductors 12 of shielded electrical cable 2 are terminated to contact elements 16 on printed circuit board 14. Examples of suitable termination methods that may be used include soldering, welding, crimping, mechanical clamping, and adhesively bonding, to name a few.

Figure 5:
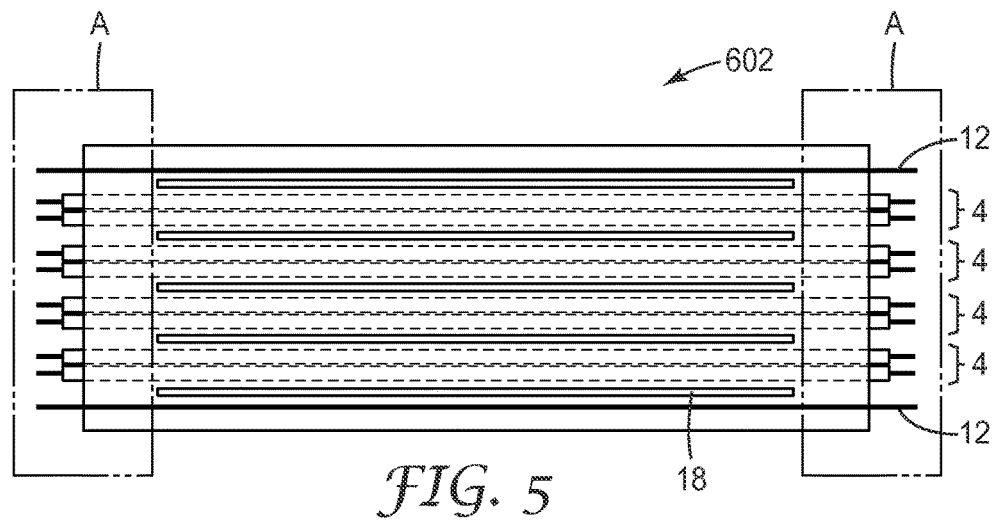
FIG. 5 is a top view of another exemplary embodiment of a shielded electrical cable according to an aspect of the present invention.

FIG. 5 illustrates another exemplary embodiment of a shielded electrical cable according to an aspect of the present invention. Shielded electrical cable 602 is similar to shielded electrical cable 2 illustrated in FIG. 1. In addition, shielded electrical cable 602 includes a plurality of longitudinal splits 18 disposed between conductor sets 4. Splits 18 separate individual conductor sets 4 at least along a portion of the length of shielded electrical cable 602, thereby increasing at least the lateral flexibility of shielded electrical cable 602. This allows shielded electrical cable 602 to be placed more easily into a curvilinear outer jacket, e.g. In other embodiments, splits 18 may be placed such as to separate individual or multiple conductor sets 4 and ground conductors 12. To maintain the spacing of conductor sets 4 and ground conductors 12, splits 18 may be discontinuous along the length of shielded electrical cable 602. To maintain the spacing of conductor sets 4 and ground conductors 12 in at least one end portion A of shielded electrical cable 602 and thereby maintaining mass-termination capability, splits 18 may not extend into one or both end portions A. Splits 18 may be formed in shielded electrical cable 602 using any suitable method, such as, e.g., laser cutting or punching. Instead of or in combination with longitudinal splits, other suitable shapes of openings may be formed in shielded electrical cable 602, such as, e.g., holes, e.g., to increase at least the lateral flexibility of shielded electrical cable 602.

Figure 6:
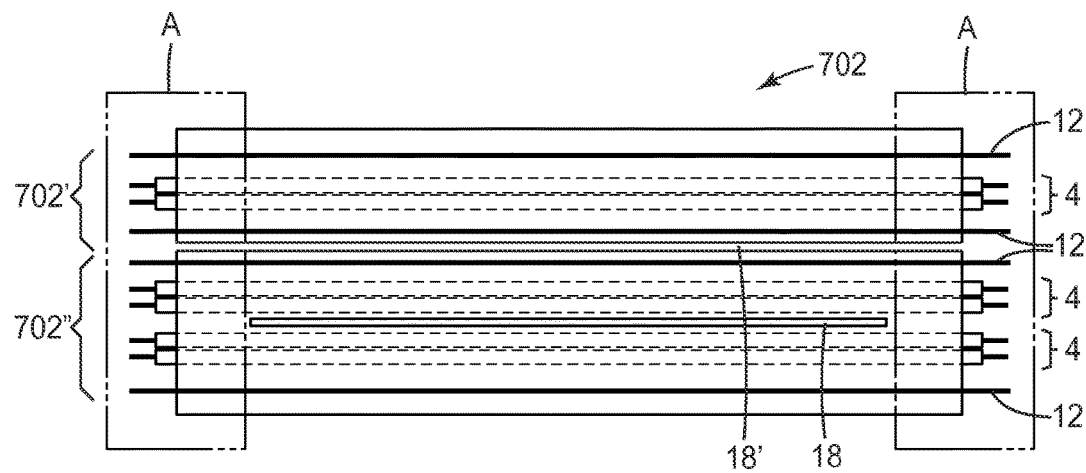
FIG. 6 is a top view of another exemplary embodiment of a shielded electrical cable according to an aspect of the present invention.

FIG. 6 illustrates another exemplary embodiment of a shielded electrical cable according to an aspect of the present invention. Shielded electrical cable 702 is similar to shielded electrical cable 602 illustrated in FIG. 5. Effectively, in shielded electrical cable 702, one of conductor sets 4 is replaced by two ground conductors 12. Shielded electrical cable 702 includes longitudinal splits 18 and 18'. Split 18 separates individual conductor sets 4 along a portion of the length of shielded electrical cable 702 and does not extend into end portions A of shielded electrical cable 702. Split 18' separates individual conductor sets 4 along the length of shielded electrical cable 702 and extends into end portions A of shielded electrical cable 702, which effectively splits shielded electrical cable 702 into two individual shielded electrical cables 702', 702". Shielding films 8 and ground conductors 12 provide an uninterrupted ground plane in each of the individual shielded electrical cables 702', 702". This exemplary embodiment illustrates the advantage of the parallel processing capability of the shielded electrical cables according to aspects of the present invention, whereby multiple shielded electrical cables may be formed simultaneously.

FIGS. 7a-7d illustrate four other exemplary embodiments of a shielded electrical cable according to aspects of the present invention. FIGS. 7a-7e are specifically intended to illustrate various examples of constructions of the shielding films of the shielded electrical cables. In one aspect, at least one of the shielding films may include a conductive layer and a non-conductive polymeric layer. The conductive layer may include any suitable conductive material, including but not limited to copper, silver, aluminum, gold, and alloys thereof. The non-conductive polymeric layer may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. The non-conductive polymeric layer may include one or more additives and/or fillers to provide properties suitable for the intended application. In another aspect, at least one of the shielding films may include a laminating adhesive layer disposed between the conductive layer and the non-conductive polymeric layer. In another aspect, at least one of the shielding films may include a stand-alone conductive film. The construction of the shielding films may be selected based on a number of design parameters suitable for the intended application, such as, e.g., flexibility, electrical performance, and configuration of the shielded electrical cable (such as, e.g., presence and location of ground conductors). In one embodiment, the shielding films include an integrally formed shielding film. In one embodiment, the shielding films have a thickness in the range of 0.01 mm to 0.05 mm. The shielding films provide isolation, shielding, and precise spacing between the conductor sets, and enable a more automated and lower cost cable manufacturing process. In addition, the shielding films prevent a phenomenon known as "signal suck-out" or resonance, whereby high signal attenuation occurs at a particular frequency range. This phenomenon typically occurs in conventional shielded electrical cables where a conductive shield is wrapped around a conductor set.

Figure 7A:
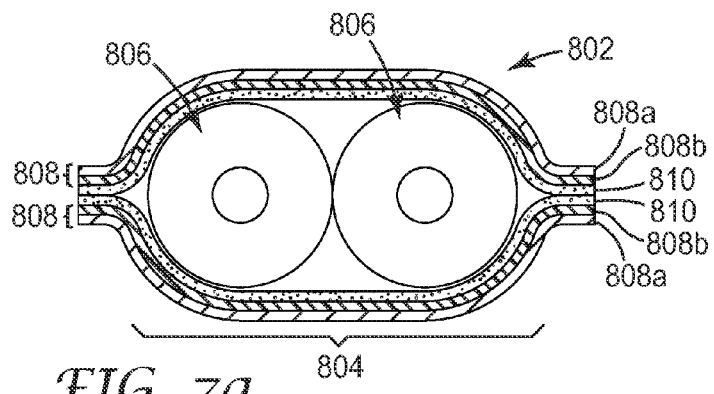
FIGS. 7a-7d are front cross-sectional views of four other exemplary embodiments of a shielded electrical cable according to aspects of the present invention.

Referring to FIG. 7a, shielded electrical cable 802 includes a single conductor set 804. Conductor set 804 includes two substantially parallel longitudinal insulated conductors 806. Two generally parallel shielding films 808 are disposed around conductor set 804. Shielding films 808 include a conformable adhesive layer 810 that bonds shielding films 808 to each other on both sides of conductor set 804. Insulated conductors 806 are arranged generally in a single plane and effectively in a twinaxial or differential pair cable arrangement. Shielding films 808 include a conductive layer 808a and a non-conductive polymeric layer 808b. Non-conductive polymeric layer 808b faces insulated conductors 806. Conductive layer 808a may be deposited onto non-conductive polymeric layer 808b using any suitable method.

Figure 7B:
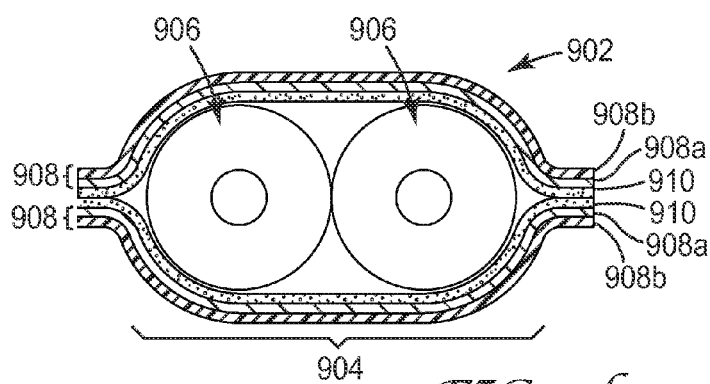

Referring to FIG. 7b, shielded electrical cable 902 includes a single conductor set 904. Conductor set 904 includes two substantially parallel longitudinal insulated conductors 906. Two generally parallel shielding films 908 are disposed around conductor set 904. Shielding films 908 include a conformable adhesive layer 910 that bonds shielding films 908 to each other on both sides of conductor set 904. Insulated conductors 906 are arranged generally in a single plane and effectively in a twinaxial or differential pair cable arrangement. Shielding films 908 include a conductive layer 908a and a non-conductive polymeric layer 908b. Conductive layer 908a faces insulated conductors 906. Conductive layer 908a may be deposited onto non-conductive polymeric layer 908b using any suitable method.

Figure 7C:
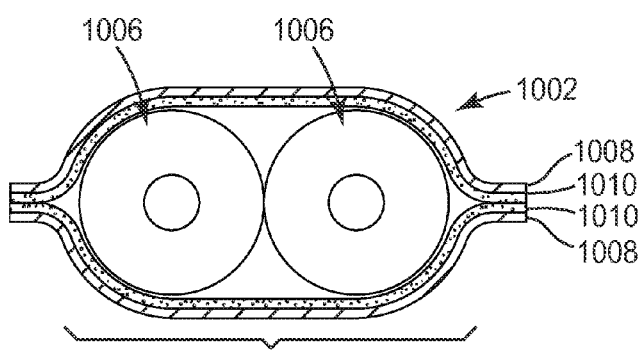

Referring to FIG. 7c, shielded electrical cable 1002 includes a single conductor set 1004. Conductor set 1004 includes two substantially parallel longitudinal insulated conductors 1006. Two generally parallel shielding films 1008 are disposed around conductor set 1004. Shielding films 1008 include a conformable adhesive layer 1010 that bonds shielding films 1008 to each other on both sides of conductor set 1004. Insulated conductors 1006 are arranged generally in a single plane and effectively in a twinaxial or differential pair cable arrangement. Shielding films 1008 include a stand-alone conductive film.

Figure 7D:
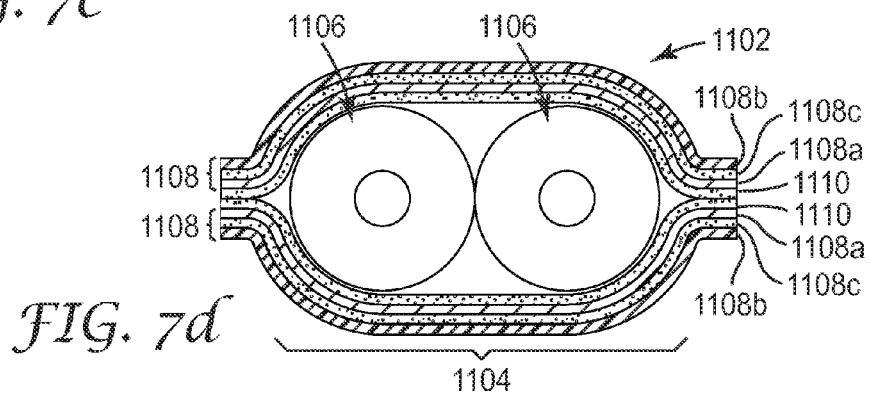

Referring to FIG. 7d, shielded electrical cable 1102 includes a single conductor set 1104. Conductor set 1104 includes two substantially parallel longitudinal insulated conductors 1106. Two generally parallel shielding films 1108 are disposed around conductor set 1104. Shielding films 1108 include a conformable adhesive layer 1110 that bonds shielding films 1108 to each other on both sides of conductor set 1104. Insulated conductors 1106 are arranged generally in a single plane and effectively in a twinaxial or differential pair cable arrangement. Shielding films 1108 include a conductive layer 1108a, a non-conductive polymeric layer 1108b, and a laminating adhesive layer 1108c disposed between conductive layer 1108a and non-conductive polymeric layer 1108b, thereby laminating conductive layer 1108a to non-conductive polymeric layer 1108b. Conductive layer 1108a faces insulated conductors 1106.

Referring back to FIG. 1, conformable adhesive layer 10 of shielded electrical cable 2 is disposed between shielding films 8 and bonds shielding films 8 to each other on both sides of each conductor set 4. In one embodiment, conformable adhesive layer 10 may be disposed on one of shielding films 8. In another embodiment, conformable adhesive layer 10 may be disposed on both shielding films 8. Conformable adhesive layer 10 may include an insulative adhesive and provide an insulative bond between shielding films 8. Optionally, conformable adhesive layer 10 may provide an insulative bond between at least one of shielding films 8 and insulated conductors 6, and between at least one of shielding films 8 and ground conductors 12. Conformable adhesive layer 10 may include a conductive adhesive and provide a conductive bond between shielding films 8. Optionally, conformable adhesive layer 10 may provide a conductive bond between at least one of shielding films 8 and ground conductors 12. Suitable conductive adhesives include conductive particles to provide the flow of electrical current. The conductive particles can be any of the types of particles currently used, such as spheres, flakes, rods, cubes, amorphous, or other particle shapes. They may be solid or substantially solid particles such as carbon black, carbon fibers, nickel spheres, nickel coated copper spheres, metal-coated oxides, metal-coated polymer fibers, or other similar conductive particles. These conductive particles can be made from electrically insulating materials that are plated or coated with a conductive material such as silver, aluminum, nickel, or indium tin-oxide. The metal-coated insulating material can be substantially hollow particles such as hollow glass spheres, or may comprise solid materials such as glass beads or metal oxides. The conductive particles may be on the order of several tens of microns to nanometer sized materials such as carbon nanotubes. Suitable conductive adhesives may also include a conductive polymeric matrix. In one aspect, conformable adhesive layer 10 may include a continuous adhesive layer extending along the entire length and width of shielding films 8. In another aspect, conformable adhesive layer 10 may include a discontinuous adhesive layer. For example, conformable adhesive layer 10 may be present only in some portions along the length or width of shielding films 8. In one embodiment, discontinuous adhesive layer 10 includes a plurality of longitudinal adhesive stripes that are disposed, e.g., on both sides of each conductor set 4 and ground conductors 12. In one embodiment, conformable adhesive layer 10 includes at least one of a pressure sensitive adhesive, a hot melt adhesive, a thermoset adhesive, and a curable adhesive. In one embodiment, conformable adhesive layer 10 is configured to provide a bond between shielding films 8 that is substantially stronger than a bond between one or more insulated conductor 6 and shielding films 8. This may be achieved, e.g., by selecting the adhesive formulation accordingly. An advantage of this adhesive configuration is that shielding films 8 are readily strippable from the insulation of insulated conductors 6. In another embodiment, conformable adhesive layer 10 is configured to provide a bond between shielding films 8 and a bond between one or more insulated conductor 6 and shielding films 8 that are substantially equally strong. An advantage of this adhesive configuration is that insulated conductors 6 are anchored between shielding films 8. On bending shielded electrical cable 2, this allows for little relative movement and therefore reduces the likelihood of buckling of shielding films 8. Suitable bond strengths may be chosen based on the intended application. In one embodiment, conformable adhesive layer 10 has a thickness of less than about 0.13 mm. In a preferred embodiment, conformable adhesive layer 10 has a thickness of less than about 0.05 mm.

Conformable adhesive layer 10 may conform to achieve desired mechanical and electrical performance characteristics of shielded electrical cable 2. In one aspect, conformable adhesive layer 10 may conform to be thinner between shielding films 8 in areas between conductor sets 4, which increases at least the lateral flexibility of shielded electrical cable 2. This allows shielded electrical cable 2 to be placed more easily into a curvilinear outer jacket, e.g. In another aspect, conformable adhesive layer 10 may conform to be thicker in areas immediately adjacent conductor sets 4 and substantially conform to conductor sets 4. This increases the mechanical strength and enables forming a curvilinear shape of shielding films 8 in these areas, which increases the durability of shielded electrical cable 2, e.g., during flexing of the cable. In addition, this helps to maintain the position and spacing of insulated conductors 6 relative to shielding films 8 along the length of shielded electrical cable 2, which results in uniform impedance and superior signal integrity of shielded electrical cable 2. In another aspect, conformable adhesive layer 10 may conform to effectively be partially of completely removed between shielding films 8 in areas between conductor sets 4. As a result, shielding films 8 electrically contact each other in these areas, which increases the electrical performance of shielded electrical cable 2. In another aspect, conformable adhesive layer 10 may conform to effectively be partially of completely removed between at least one of shielding films 8 and ground conductors 12. As a result, ground conductors 12 electrically contact at least one of shielding films 8 in these areas, which increases the electrical performance of shielded electrical cable 2. Even if a thin conformable adhesive layer 10 exists between at least one of shielding films 8 and ground conductors 12, asperities on ground conductors 12 may break through conformable adhesive layer 10 to establish electrical contact as intended.

Figure 8A:
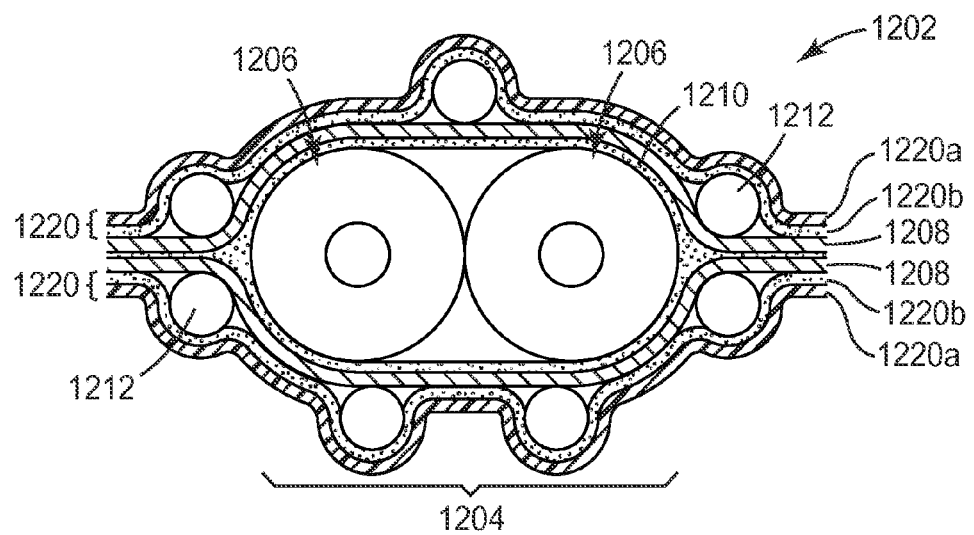
FIGS. 8a-8c are front cross-sectional views of three other exemplary embodiments of a shielded electrical cable according to aspects of the present invention.
Figure 8B:
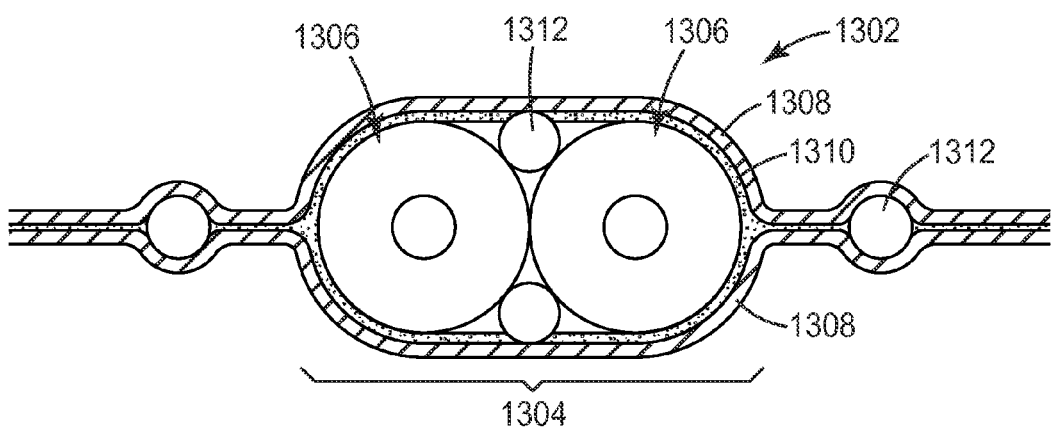
Figure 8C:
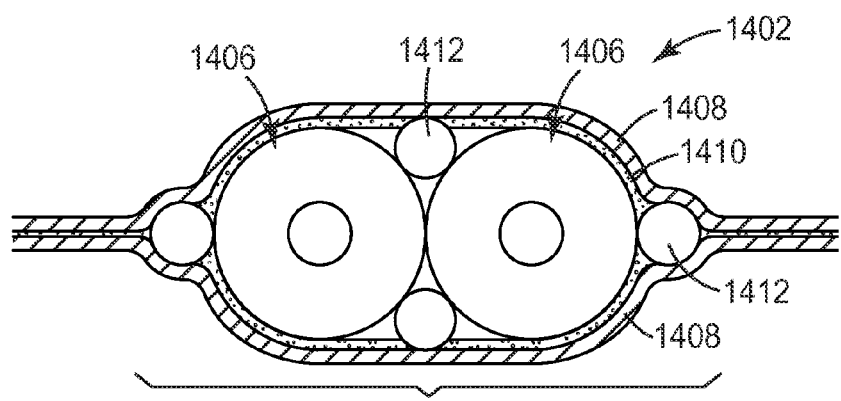

FIGS. 8a-8c illustrate three other exemplary embodiments of a shielded electrical cable according to aspects of the present invention. FIGS. 8a-8c are specifically intended to illustrate examples of the placement of ground conductors in the shielded electrical cables. An aspect of a shielded electrical cable is proper grounding of the shield. Shielded electrical cables according to aspects of the present invention can be grounded in a number of ways. In one aspect, the ground conductors electrically contact at least one of the shielding films such that grounding the ground conductors also grounds the shielding films. In this arrangement, the ground conductors may also be referred to as "drain wires". In another aspect, the ground conductors do not electrically contact the shielding films, but are individual elements in the cable construction that may be independently terminated to any suitable individual contact element of any suitable termination point, such as, e.g., a contact element on a printed circuit board. In this arrangement, the ground conductors may also be referred to as "ground wires". FIG. 8a illustrates an exemplary embodiment of a shielded electrical cable according to an aspect of the present invention wherein the ground conductors are positioned external to the shielding films. FIGS. 8b-8c illustrate two exemplary embodiments of a shielded electrical cable according to aspects of the present invention wherein the ground conductors are positioned between the shielding films, and may be included in the conductor set. One or more ground conductors may be placed in any suitable position external to the shielding films, between the shielding films, or a combination of both.

Referring to FIG. 8a, shielded electrical cable 1202 includes a single conductor set 1204. Conductor set 1204 includes two substantially parallel longitudinal insulated conductors 1206. Two generally parallel shielding films 1208 are disposed around conductor set 1204. A conformable adhesive layer 1210 is disposed between shielding films 1208 and bonds shielding films 1208 to each other on both sides of conductor set 1204. Insulated conductors 1206 are arranged generally in a single plane and effectively in a twinaxial or differential pair cable arrangement. Shielded electrical cable 1202 further includes a plurality of ground conductors 1212 positioned external to shielding films 1208. Ground conductors 1212 are placed over, under, and on both sides of conductor set 1204. Optionally, shielded electrical cable 1202 includes protective films 1220 surrounding shielding films 1208 and ground conductors 1212. Protective films 1220 include a protective layer 1220a and an adhesive layer 1220b bonding protective layer 1220a to shielding films 1208 and ground conductors 1212. Alternatively, shielding films 1208 and ground conductors 1212 may be surrounded by an outer conductive shield, such as, e.g., a conductive braid, and an outer insulative jacket (not shown).

Referring to FIG. 8b, shielded electrical cable 1302 includes a single conductor set 1304. Conductor set 1304 includes two substantially parallel longitudinal insulated conductors 1306. Two generally parallel shielding films 1308 are disposed around conductor set 1304. A conformable adhesive layer 1310 is disposed between shielding films 1308 and bonds shielding films 1308 to each other on both sides of conductor set 1304. Insulated conductors 1306 are arranged generally in a single plane and effectively in a twinaxial or differential pair cable arrangement. Shielded electrical cable 1302 further includes a plurality of ground conductors 1312 positioned between shielding films 1308. Two of the ground conductors 1312 are included in conductor set 1304, and two of the ground conductors 1312 are spaced apart from conductor set 1304.

Referring to FIG. 8c, shielded electrical cable 1402 includes a single conductor set 1404. Conductor set 1404 includes two substantially parallel longitudinal insulated conductors 1406. Two generally parallel shielding films 1408 are disposed around conductor set 1404. A conformable adhesive layer 1410 is disposed between shielding films 1408 and bonds shielding films 1408 to each other on both sides of conductor set 1404. Insulated conductors 1406 are arranged generally in a single plane and effectively in a twinaxial or differential pair cable arrangement. Shielded electrical cable 1402 further includes a plurality of ground conductors 1412 positioned between shielding films 1408. All of the ground conductors 1412 are included in conductor set 1404. Two of the ground conductors 1412 and insulated conductors 1406 are arranged generally in a single plane.

Figure 9A:
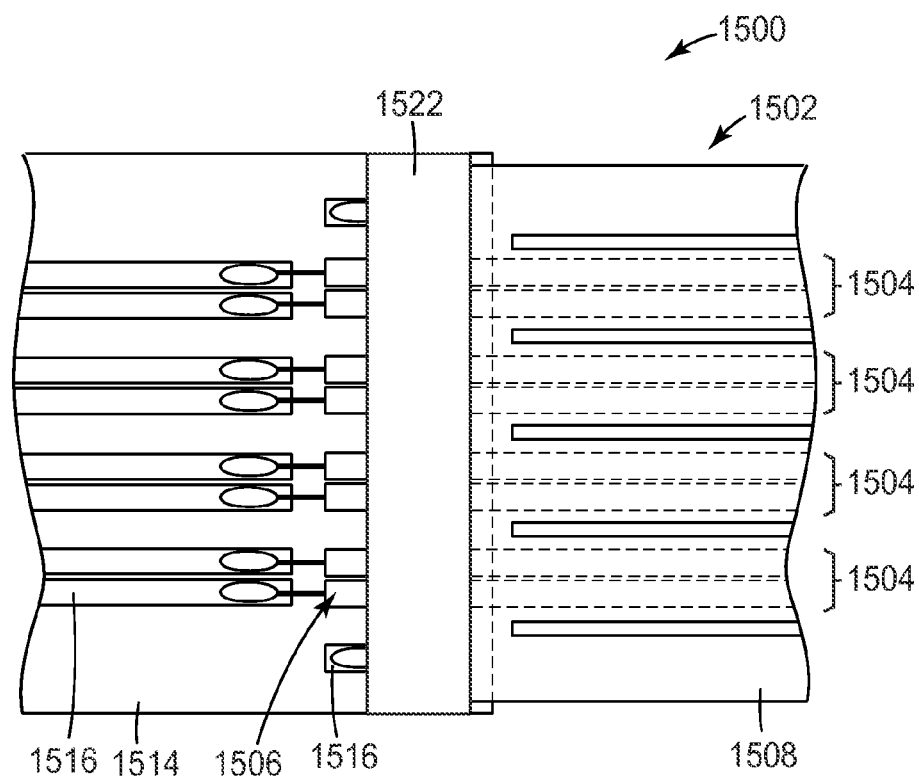
FIGS. 9a-9b are top and partially cross-sectional front views, respectively, of an exemplary embodiment of an electrical assembly according to an aspect of the present invention terminated to a printed circuit board.
Figure 9B:
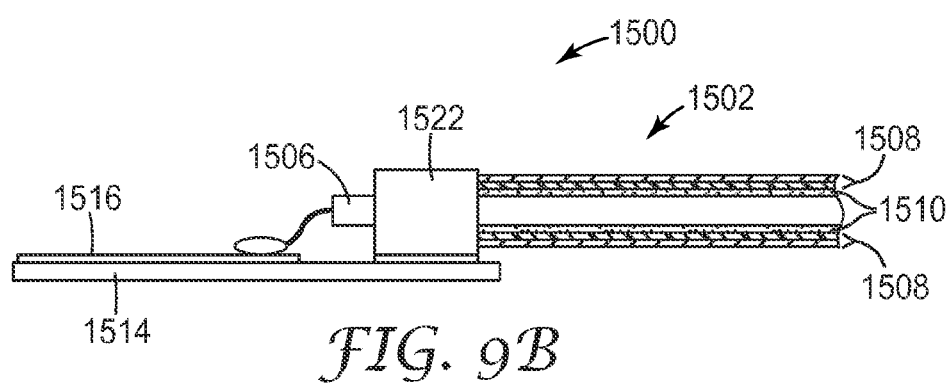

FIGS. 9a-9b illustrate an exemplary embodiment of an electrical assembly according to an aspect of the present invention terminated to a printed circuit board. Electrical assembly 1500 includes a shielded electrical cable 1502 and an electrically conductive cable clip 1522. Shielded electrical cable 1502 includes a plurality of spaced apart conductor sets 1504 arranged generally in a single plane. Each conductor set includes two substantially parallel longitudinal insulated conductors 1506. Two generally parallel shielding films 1508 are disposed around conductor sets 1504. A conformable adhesive layer 1510 is disposed between shielding films 1508 and bonds shielding films 1508 to each other on both sides of each conductor set 1504. Cable clip 1522 is clamped or otherwise attached to an end portion of shielded electrical cable 1502 such that at least one of shielding films 1508 electrically contacts cable clip 1522. Cable clip 1522 is configured for termination to a ground reference, such as, e.g., contact element 1516 on printed circuit board 1514, to establish a ground connection between shielded electrical cable 1502 and the ground reference. Cable clip may be terminated to the ground reference using any suitable method, including soldering, welding, crimping, mechanical clamping, and adhesively bonding, to name a few. When terminated, cable clip 1522 may facilitate termination of the end portions of the conductors of insulated conductors 1506 of shielded electrical cable 1502 to contact elements of a termination point, such as, e.g., contact elements 16 on printed circuit board 14. Shielded electrical cable 1502 may include one or more ground conductors as described herein that may electrically contact cable clip 1522 in addition to or instead of at least one of shielding films 1508.

FIGS. 10a-10g illustrate an exemplary method of making a shielded electrical cable according to an aspect of the present invention. Specifically, FIGS. 10a-10g illustrate an exemplary method of making shielded electrical cable 2 illustrated in FIG. 1.

Figure 10D:
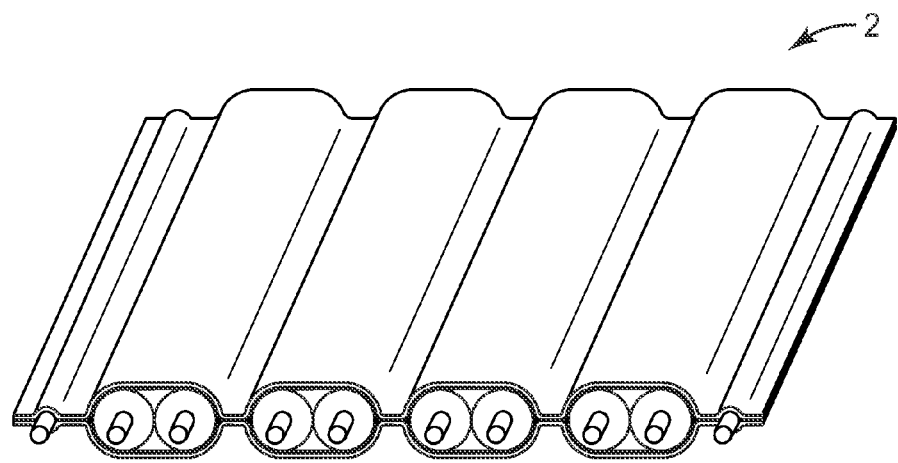
Figure 10E:
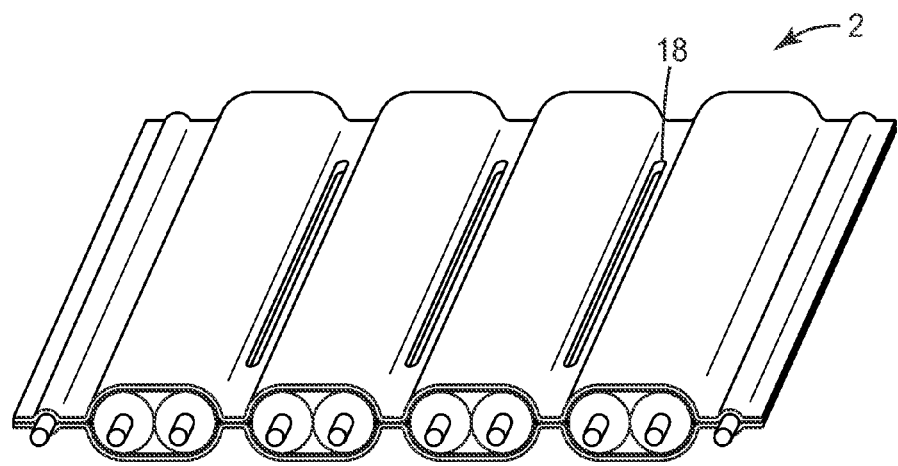
Figures 10F, 10G:
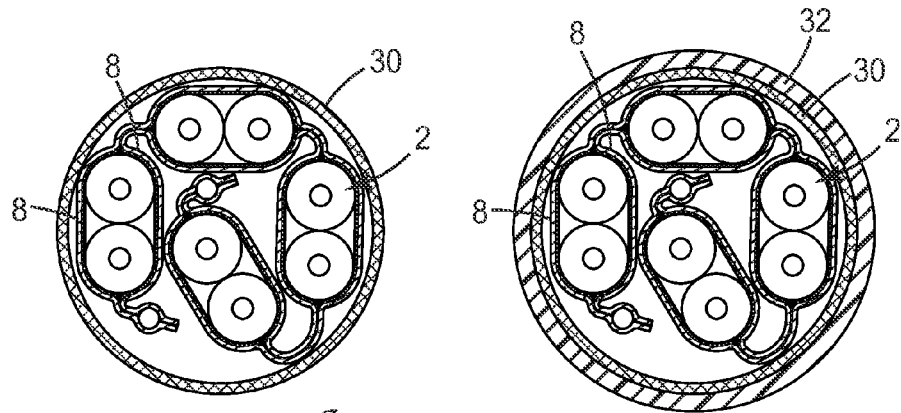

In the step illustrated in FIG. 10a, insulated conductors 6 are formed using any suitable method, such as, e.g., extrusion. Insulated conductors 6 may be formed of any suitable length. Insulated conductors 6 may then be provided as such or cut to a desired length. Ground conductors 12 may be formed and provided in a similar fashion (not shown). In the step illustrated in FIG. 10b, shielding films 8 are formed. A single layer or multilayer web may be formed using any suitable method, such as, e.g., continuous wide web processing. Shielding films 8 may be formed of any suitable length. Shielding films 8 may then be provided as such or cut to a desired length and/or width. Shielding films 8 may be pre-formed to have transverse partial folds to increase flexibility in the longitudinal direction. As illustrated in FIG. 10b, shielding films 8 include conformable adhesive layer 10, which may be formed on shielding films 8 using any suitable method, such as, e.g., laminating or sputtering. In the step illustrated in FIG. 10c, a plurality of insulated conductors 6, ground conductors 12, and shielding films 8 are provided. A forming tool 24 is provided. Forming tool 24 includes a pair of forming rolls 26a, 26b having a shape corresponding to a cross-sectional shape of shielded electrical cable 2 and include a bite 28. Insulated conductors 6, ground conductors 12, and shielding films 8 are arranged according to the configuration of shielded electrical cable 2, and positioned in proximity to forming rolls 26a, 26b, after which they are concurrently fed into bite 28 of forming rolls 26a, 26b and disposed between forming rolls 26a, 26b. Forming tool 24 forms shielding films 8 around conductor sets 4 and ground conductor 12 and bonds shielding films 8 to each other on both sides of each conductor set 4 and ground conductors 12. Heat may be applied to facilitate bonding. Although in this embodiment, forming shielding films 8 around conductor sets 4 and ground conductor 12 and bonding shielding films 8 to each other on both sides of each conductor set 4 and ground conductors 12 occur in a single operation, in other embodiments, these steps may occur in separate operations. FIG. 10d illustrates shielded electrical cable 2 as it is formed by forming tool 24. In the step illustrated in FIG. 10e, longitudinal splits 18 are formed between conductor sets 4. Splits 18 may be formed in shielded electrical cable 2 using any suitable method, such as, e.g., laser cutting or punching. In the step illustrated in FIG. 10f, shielding films 8 of shielded electrical cable 2 are folded and an outer conductive shield 30 is provided around the folded shielding films 8 using any suitable method. In the step illustrated in FIG. 10g, an outer jacket 32 is provided around outer conductive shield 30 using any suitable method, such as, e.g., extrusion. In other embodiments, outer conductive shield 30 may be omitted and outer jacket 32 may be provided around the folded shielding films 8.

Figure 11A:
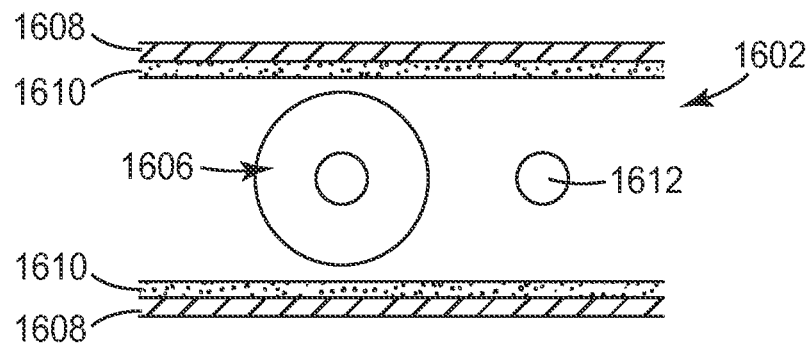
FIGS. 11a-11c are front cross-sectional views illustrating a detail of an exemplary method of making a shielded electrical cable according to an aspect of the present invention.
Figure 11B:
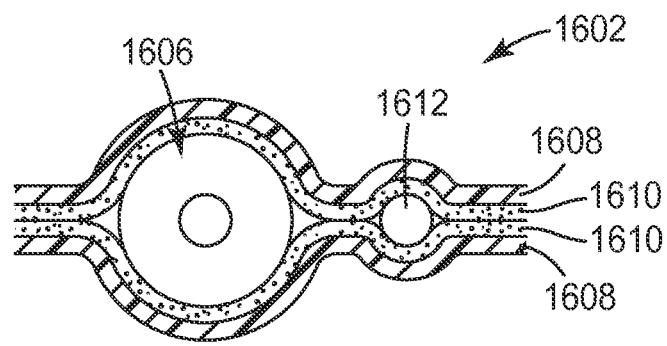
Figure 11C:
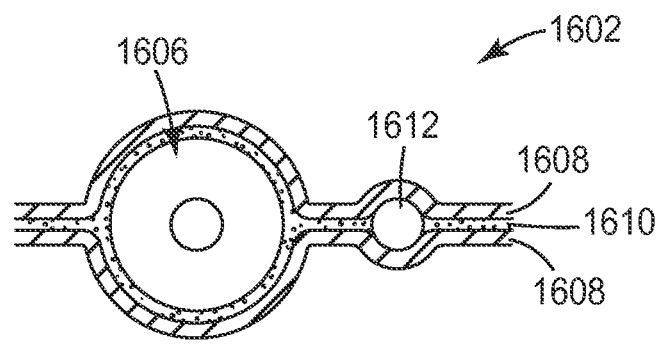

FIGS. 11a-11c illustrate a detail of an exemplary method of making a shielded electrical cable according to an aspect of the present invention. FIGS. 11a-11c are specifically intended to illustrate an example of the conforming of conformable adhesive layers during the forming and bonding of shielding films.

In the step illustrated in FIG. 11a, an insulated conductor 1606, a ground conductor 1612 spaced apart from insulated conductor 1606, and two shielding films 1608 are provided. Shielding films 1608 each include a conformable adhesive layer 1610. In the steps illustrated in FIGS. 11b-11c, shielding films 1608 are formed around insulated conductor 1606 and ground conductor 1612 and bonded to each other. Initially, as illustrated in FIG. 11b, conformable adhesive layers 1610 still have their original thickness. As the forming and bonding of shielding films 1608 proceeds, conformable adhesive layers 1610 conform to achieve desired mechanical and electrical performance characteristics of shielded electrical cable 1602. Specifically, as illustrated in FIG. 11*c*, conformable adhesive layers 1610 conform to be thinner between shielding films 1608 on both sides of insulated conductor 1606 and ground conductor 1612; a portion of conformable adhesive layers 1610 displaces away from these areas. Further, conformable adhesive layers 1610 conform to be thicker in areas immediately adjacent insulated conductor 1606 and ground conductor 1612, and substantially conform to insulated conductor 1606 and ground conductor 1612; a portion of conformable adhesive layers 1610 displaces into these areas. Further, conformable adhesive layers 1610 conform to effectively be removed between shielding films 1608 and ground conductor 1612; conformable adhesive layers 1610 displace away from these areas such that ground conductor 1612 electrically contacts shielding films 1608.

In certain exemplary embodiments, the shielded electrical cable according to an aspect of the present invention includes a transition portion positioned on one or both sides of the conductor set. This transition portion is configured to provide high manufacturability and strain and stress relief of the shielded electrical cable. Maintaining this transition portion at a substantially constant configuration (including aspects such as, e.g., size, shape, and content) along the length of the shielded electrical cable facilitates the shielded electrical cable to have substantially uniform electrical properties, such as, e.g., impedance, skew, insertion loss, reflection, mode conversion, eye opening, and jitter. Additionally, in certain embodiments, such as, e.g., embodiments wherein the conductor set includes two substantially parallel longitudinal insulated conductors arranged generally in a single plane and effectively in a twinaxial or differential pair cable arrangement, maintaining this transition portion at a substantially constant configuration along the length of the shielded electrical cable beneficially provides substantially the same electromagnetic field deviation from an ideal concentric case for both conductors in the conductor set. Thus, careful control of the configuration of this transition portion along the length of the shielded electrical cable contributes to the electrical performance of the cable. FIGS. 12*a*-14*b* illustrate various exemplary embodiments of a shielded electrical cable according to aspects of the present invention that include a transition portion disposed on one or both sides of the conductor set.

Figure 12A:
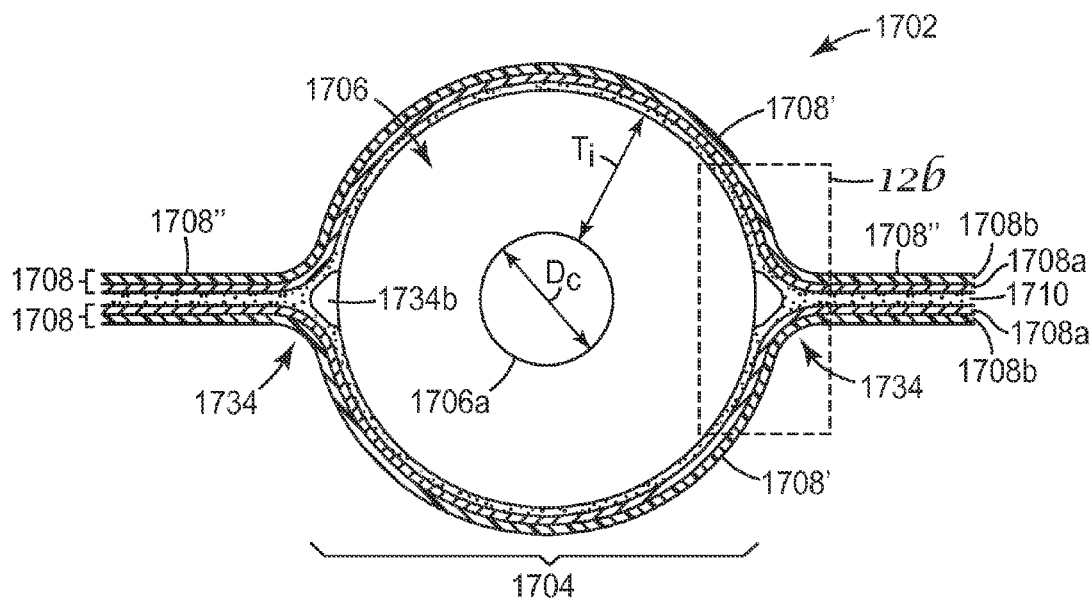
FIGS. 12a-12b are a front cross-sectional view of another exemplary embodiment of a shielded electrical cable according to an aspect of the present invention and a corresponding detail view, respectively.
Figure 12B:
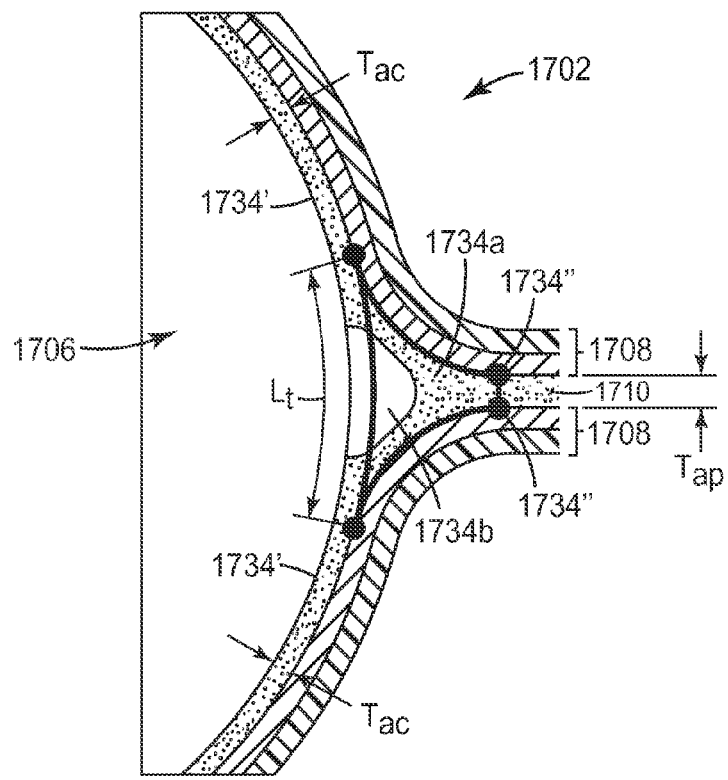

Referring now to FIGS. 12*a*-12*b*, shielded electrical cable 1702 includes a single conductor set 1704. Conductor set 1704 includes a single longitudinal insulated conductor 1706. Two generally parallel shielding films 1708 are disposed around conductor set 1704. An optional conformable adhesive layer 1710 is disposed between shielding films 1708 and bonds shielding films 1708 to each other on both sides of conductor set 1704. Insulated conductor 1706 is effectively arranged in a coaxial or single ended cable arrangement. Shielding films 1708 include a conductive layer 1708*a* and a non-conductive polymeric layer 1708*b*. Conductive layer 1708*a* faces insulated conductors 1706. This configuration of shielding films 1708 is similar to the configuration of shielding films 908 shown in FIG. 7*b*. Alternatively, the configuration of shielding films 1708 may be similar to the configuration of shielding films 808 shown in FIG. 7*a*, shielding films 1008 shown in FIG. 7*c*, or shielding films 1108 shown in FIG. 7*d*, for example. Shielding films 1708 include a concentric portion 1708' substantially concentric with conductor 1706 and parallel portions 1708" wherein shielding films 1708 are substantially parallel. In other embodiments, shielding films 1708 may include a single parallel portion 1708". Shielded electrical cable 1702 further includes transition portions 1734 positioned on both sides of conductor set 1704. In other embodiments, shielded electrical cable 1702 may include a transition portion 1734 positioned on only one side of conductor set 1704. Transition portions 1734 are defined by shielding films 1708 and conductor set 1704 and provide a gradual transition between concentric portion 1708' and parallel portion 1708" of shielding films 1708. As opposed to a sharp transition, such as, e.g., a right-angle transition or a transition point (as opposed to a transition portion), a gradual transition, such as, e.g., a substantially sigmoidal transition, provides strain and stress relief for shielding films 1708 in transition portions 1734 and prevents damage to shielding films 1708 when shielded electrical cable 1702 is in use, e.g., when laterally or axially bending shielded electrical cable 1702. This damage may include, e.g., fractures in conductive layer 1708*a* and/or debonding between conductive layer 1708*a* and non-conductive polymeric layer 1708*b*. In addition, a gradual transition prevents damage to shielding films 1708 in manufacturing of shielded electrical cable 1702, which may include, e.g., cracking or shearing of conductive layer 1708*a* and/or non-conductive polymeric layer 1708*b*.

The configuration of shielded electrical cables according aspects of the present invention including a transition portion on one or both sides of the conductor set represents a departure from conventional cable configurations, such as, e.g., an ideal coaxial cable, wherein a shield is generally continuously disposed around a single insulated conductor, or an ideal twinaxial cable, wherein a shield is generally continuously disposed around a pair of insulated conductors. Although these ideal cable configurations provide ideal electromagnetic profiles, these profiles are not necessary to achieve acceptable electrical properties. In the shielded electrical cables according to aspects of the present invention, acceptable electrical properties can be achieved by minimizing the electrical impact of the transition portion, e.g., by minimizing the size of the transition portion and carefully controlling the configuration of the transition portion along the length of the shielded electrical cable. Minimizing the size of the transition portion minimizes the capacitance deviation and minimizes the required space between multiple conductor sets, thereby reducing the conductor set pitch and/or increasing the electrical isolation between conductor sets. Careful control of the configuration of the transition portion along the length of the shielded electrical cable contributes to obtaining predictable electrical behavior and consistency, which is important for high speed transmission lines so that electrical data can be reliably transmitted, and becomes more important when the size of the transition portion cannot be minimized. An electrical characteristic that is often considered is the characteristic impedance of the transmission line. Any impedance changes along the length of a transmission line may cause power to be reflected back to the source instead of being transmitted to the target. Ideally, the transmission line will have no impedance variation along its length, but, depending on the intended application, variations up to 5-10% may be acceptable. Another electrical characteristic that is often considered in twinaxial cables (differentially driven) is skew or unequal transmission speeds of two transmission lines of a pair along at least a portion of their length. Skew produces conversion of the differential signal to a common mode signal that can be reflected back to the source, reduces the transmitted signal strength, creates electromagnetic radiation, and dramatically increases the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable. Alternatively, skew can be measured in the time domain and compared to a required specification. Depending on the intended application, values of less than about 20 picoseconds/meter (ps/m) and preferably less than about 10 ps/m may be acceptable.

Referring back to FIGS. 12a-12b, in part to help achieve acceptable electrical properties, transition portions 1734 of shielded electrical cable 1702 may each include a cross-sectional area 1734a that is smaller than a cross-sectional area 1706a of conductor 1706. As best shown in FIG. 12b, cross-sectional area 1734a of transition portion 1734 is defined by transition points 1734', where shielding films 1708 deviate from being substantially concentric with insulated conductor 1706, and transition points 1734'', where shielding films 1708 deviate from being substantially parallel. In addition, each cross-sectional area 1734a may include a void portion 1734b. Void portions 1734b may be substantially the same. Further, conformable adhesive layer 1710 may have a thickness $T_{ac}$ in concentric portion 1708', and a thickness in transition portion 1734 that is greater than thickness $T_{ac}$ in concentric portion 1708'. Similarly, conformable adhesive layer 1710 may have a thickness $T_{ap}$ in parallel portion 1708'', and a thickness in transition portion 1734 that is greater than thickness $T_{ap}$ in parallel portion 1708''. Conformable adhesive layer 1710 may represent at least 25% of cross-sectional area 1734a. The presence of conformable adhesive layer 1710 in cross-sectional area 1734a, in particular at a thickness that is greater than thickness $T_{ac}$ or thickness $T_{ap}$, contributes to the strength of transition portion 1734. Careful control of the manufacturing process and the material characteristics of the various elements of shielded electrical cable 1702 may reduce variations in void portion 1734b and the thickness of conformable adhesive layer 1710 in transition portion 1734, which may in turn reduce variations in the capacitance of cross-sectional area 1734a. Shielded electrical cable 1702 may include a transition portion 1734 positioned on one or both sides of conductor set 1704 that includes a cross-sectional area 1734a that is substantially equal to or smaller than a cross-sectional area 1706a of conductor 1706. Shielded electrical cable 1702 may include a transition portion 1734 positioned on one or both sides of conductor set 1704 that includes a cross-sectional area 1734a that is substantially the same along the length of conductor 1706. For example, cross-sectional area 1734a may vary less than 50% over a length of 1 m. Shielded electrical cable 1702 may include transition portions 1734 positioned on both sides of conductor set 1704 that each include a cross-sectional area 1734a, wherein the sum of cross-sectional areas 1734a is substantially the same along the length of conductor 1706. For example, the sum of cross-sectional areas 1734a may vary less than 50% over a length of 1 m. Shielded electrical cable 1702 may includes transition portions 1734 positioned on both sides of conductor set 1704 that each include a cross-sectional area 1734a, wherein the cross-sectional areas 1734a are substantially the same. Shielded electrical cable 1702 may include transition portions 1734 positioned on both sides of conductor set 1704, wherein the transition portions 1734 are substantially identical. Insulated conductor 1706 has an insulation thickness $T_i$, and transition portion 1734 may have a lateral length $L_t$ that is less than insulation thickness $T_i$. Insulated conductor 1706 has a diameter $D_c$, and transition portion 1734 may have a lateral length $L_t$ that is less than diameter $D_c$. The various configurations described above may provide a characteristic impedance that remains within a desired range, such as, e.g., within 5-10% of a target impedance value, such as, e.g., 50 Ohms, over a given length, such as, e.g., 1 m.

Factors that control the configuration of transition portion 1734 along the length of shielded electrical cable 1702 include the manufacturing process, the thickness of conductive layers 1708a and non-conductive polymeric layers 1708b, conformable adhesive layer 1710, and the bond strength between insulated conductor 1706 and shielding films 1708, to name a few.

In one aspect, conductor set 1704, shielding films 1708, and transition portion 1734 are cooperatively configured in an impedance controlling relationship. An impedance controlling relationship means that conductor set 1704, shielding films 1708, and transition portion 1734 are cooperatively configured to control the characteristic impedance of the shielded electrical cable.

Figure 13A:
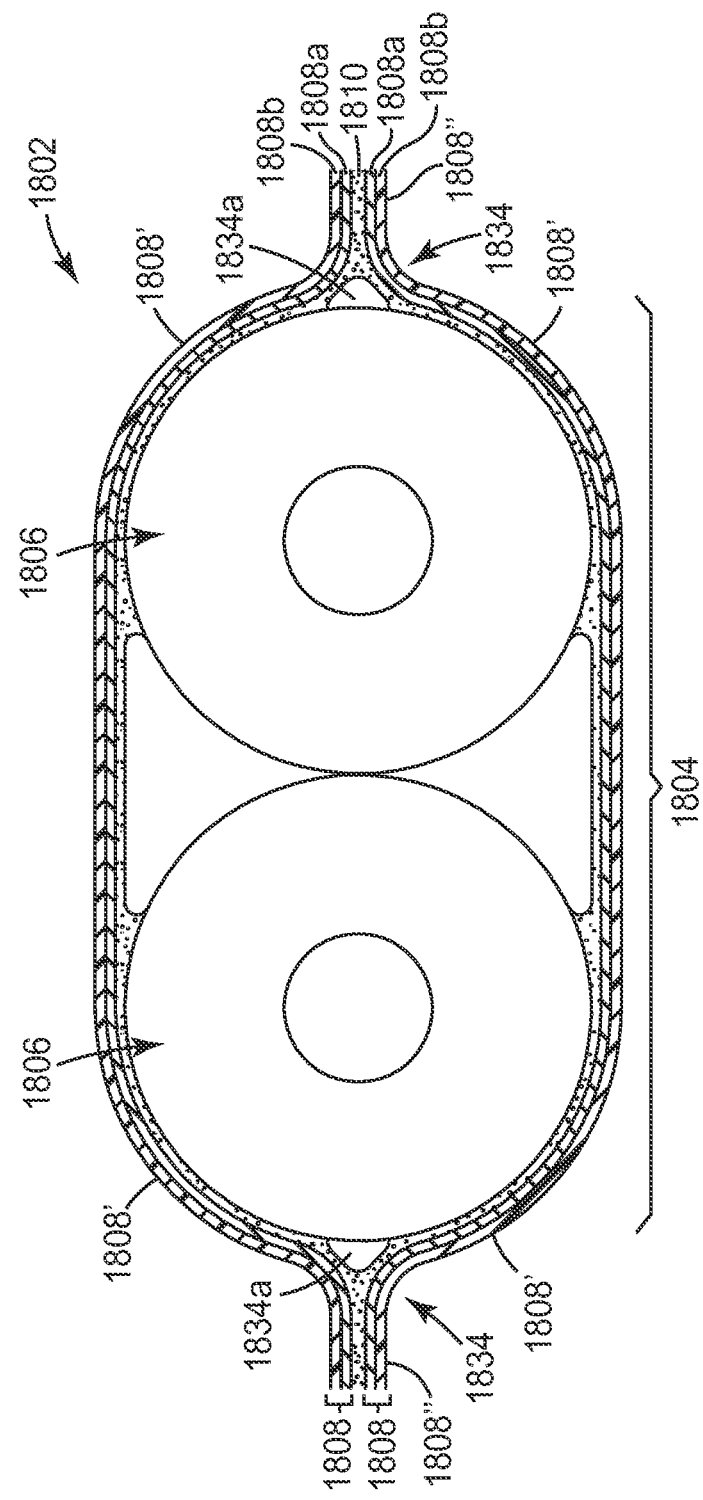
FIGS. 13a-13b are front cross-sectional views of two other exemplary embodiments of a shielded electrical cable according to an aspect of the present invention.
Figure 13B:
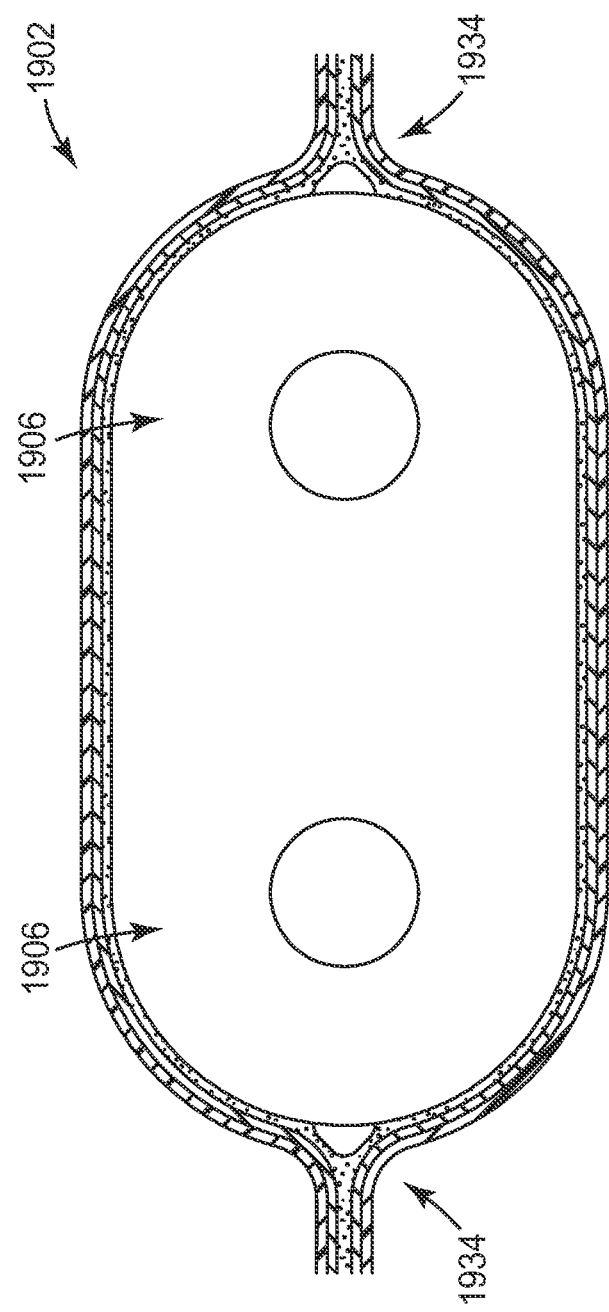

FIGS. 13a-13b illustrate two other exemplary embodiments of a shielded electrical cable according to aspects of the present invention including two insulated conductors. Referring to FIG. 13a, shielded electrical cable 1802 includes a single conductor set 1804 including two substantially parallel longitudinal individually insulated conductors 1806. Two generally parallel shielding films 1808 are disposed around conductor set 1804. An optional conformable adhesive layer 1810 is disposed between shielding films 1808 and bonds shielding films 1808 to each other on both sides of conductor set 1804. Insulated conductors 1806 are arranged generally in a single plane and effectively in a twinaxial or differential pair cable arrangement. Shielding films 1808 include a conductive layer 1808a and a non-conductive polymeric layer 1808b. Conductive layer 1808a faces insulated conductors 1806. Shielding films 1808 include concentric portions 1808' substantially concentric with corresponding conductors 1806 and parallel portions 1808'' wherein shielding films 1808 are substantially parallel. Shielded electrical cable 1802 includes transition portions 1834 positioned on both sides of conductor set 1804 that each include a cross-sectional area 1834a, wherein the sum of cross-sectional areas 1834a is substantially the same along the length of conductors 1806. For example, the sum of cross-sectional areas 1834a may vary less than 50% over a length of 1 m. In addition, cross-sectional areas 1834a are substantially the same and transition portions 1834 are substantially identical. This configuration of transition portions 1834 may provide a characteristic impedance for each conductor 1806 (single-ended) and a differential impedance that both remain within a desired range, such as, e.g., within 5-10% of a target impedance value over a given length, such as, e.g., 1 m. In addition, this configuration of transition portions 1834 may minimize skew of the two conductors 1806 along at least a portion of their length. Referring to FIG. 13b, shielded electrical cable 1902 is similar to shielded electrical cable 1802. Whereas shielded electrical cable 1802 has individually insulated conductors 1806, shielded electrical cable 1902 has jointly insulated conductors 1906. Nonetheless, transition portions 1934 are identical to transition portions 1834 and provide the same benefits to shielded electrical cable 1902.

Figure 14B:
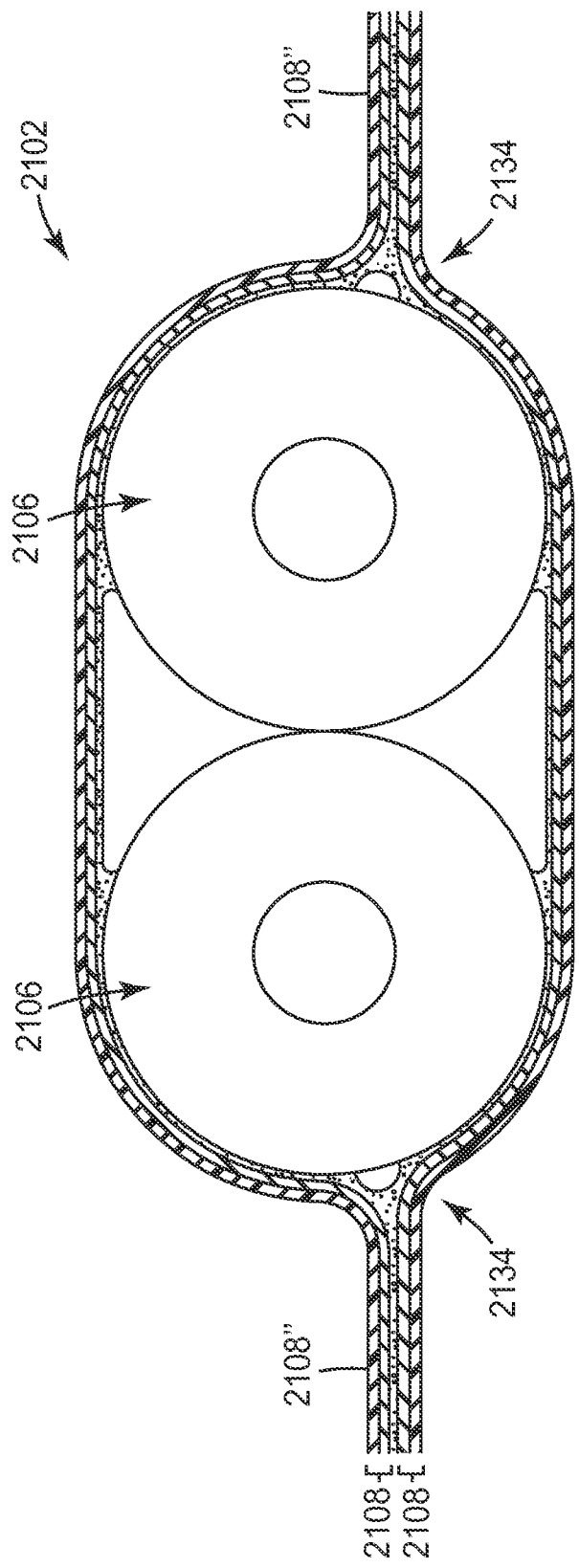

FIGS. 14a-14b illustrate two other exemplary embodiments of a shielded electrical cable according to aspects of the present invention including two insulated conductors. These exemplary embodiments are intended to illustrate variations in position and configuration of the transition portions. Shielded electrical cables 2002 (FIGS. 14a) and 2102 (FIG. 14b) are similar to shielded electrical cable 1802. Whereas in shielded electrical cable 1802, parallel portions 1808" of shielding films 1808 and insulated conductors 1806 are arranged generally in a single plane, in shielded electrical cables 2002 and 2102, parallel portions 2008" and 2108" of shielding films 2008 and 2108 and insulated conductors 2006 and 2106 are arranged in different planes. As a result, transition portions 2034 and 2134 have a different position and configuration. For reasons including that transition portions 2034 and 2134 are positioned substantially symmetrically with respect to corresponding insulated conductors 2006 and 2106 and that the configuration of transition portions 2034 and 2134 is carefully controlled along the length of shielded electrical cables 2002 and 2102, shielded electrical cables 2002 and 2102 are configured to still provide acceptable electrical properties.

In further exemplary embodiments, shielded electrical cables according to aspects of the present invention include a plurality of spaced apart conductor sets arranged generally in a single plane. Each conductor set includes one or more substantially parallel longitudinal insulated conductors. Two generally parallel shielding films are disposed around the conductor sets and include a plurality of concentric portions substantially concentric with at least one of the conductors and a plurality of parallel portions wherein the shielding films are substantially parallel. A plurality of transition portions defined by the shielding films and the conductor sets provide a gradual transition between the concentric portions and the parallel portions of the shielding films. The transition portions may be positioned on both sides of each conductor set. For example, the shielded electrical cable may include a combination of one or more conductor sets 1704, wherein insulated conductor 1706 is effectively arranged in a coaxial or single ended cable arrangement, and one or more conductor sets 1804, wherein insulated conductors 1806 are effectively arranged in a twinaxial or differential pair cable arrangement. The conductor sets, shielding films and transition portions may be cooperatively configured in an impedance controlling relationship.

FIGS. 15a-15c, 18 and 19 illustrate several other exemplary embodiments of a shielded electrical cable according to aspects of the present invention. FIGS. 16a-16g, 17a-17b and 20a-20f illustrate several exemplary embodiments of a parallel portion of a shielded electrical cable according to aspects of the present invention. FIGS. 15a-20f are specifically intended to illustrate examples of a parallel portion that is configured to electrically isolate a conductor set of the shielded electrical cable. The conductor set may be electrically isolated from an adjacent conductor set (e.g., to minimize crosstalk between adjacent conductor sets, FIGS. 15a-15c and 16a-16g) or from the external environment of the shielded electrical cable (e.g., to minimize electromagnetic radiation escape from the shielded electrical cable and minimize electromagnetic interference from external sources, FIGS. 19 and 20a-20f). In both cases, the parallel portion may include various mechanical structures to realize the electrical isolation. Examples include close proximity of the shielding films, high dielectric constant material between the shielding films, ground conductors that make direct or indirect electrical contact with at least one of the shielding films, extended distance between adjacent conductor sets, physical breaks between adjacent conductor sets, intermittent contact of the shielding films to each other directly either longitudinally, transversely, or both, and conductive adhesive, to name a few. In one aspect, a parallel portion of the shielding films is defined as a portion of the shielding films that is not covering a conductor set.

Figure 15A:
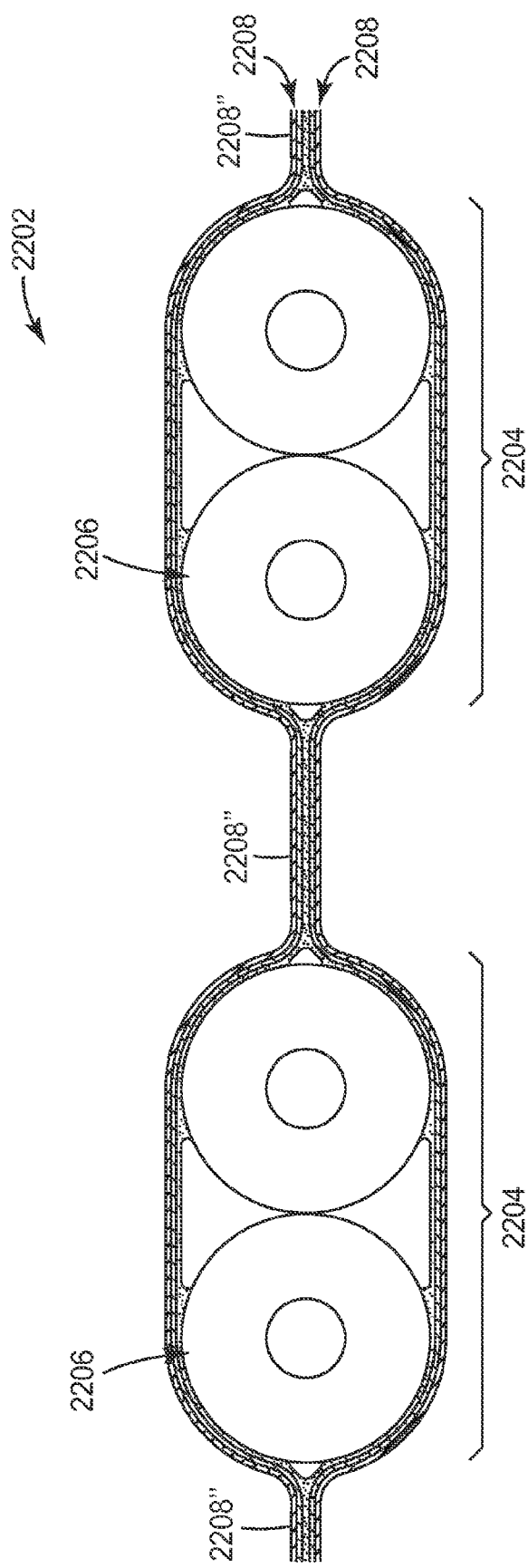
FIGS. 15a-15c are front cross-sectional views of three other exemplary embodiments of a shielded electrical cable according to aspects of the present invention.

In FIG. 15a, shielded electrical cable 2202 includes two conductor sets 2204, each including two substantially parallel longitudinal insulated conductors 2206, and two generally parallel shielding films 2208 disposed around conductor sets 2204. Shielding films 2208 include parallel portions 2208" wherein shielding films 2208 are substantially parallel. Parallel portions 2208" positioned in between conductor sets 2204 are configured to electrically isolate conductor sets 2204 from each other. In shielded electrical cable 2202, parallel portions 2208" of shielding films 2208 and insulated conductors 2206 are arranged generally in a single plane.

Figure 15B:
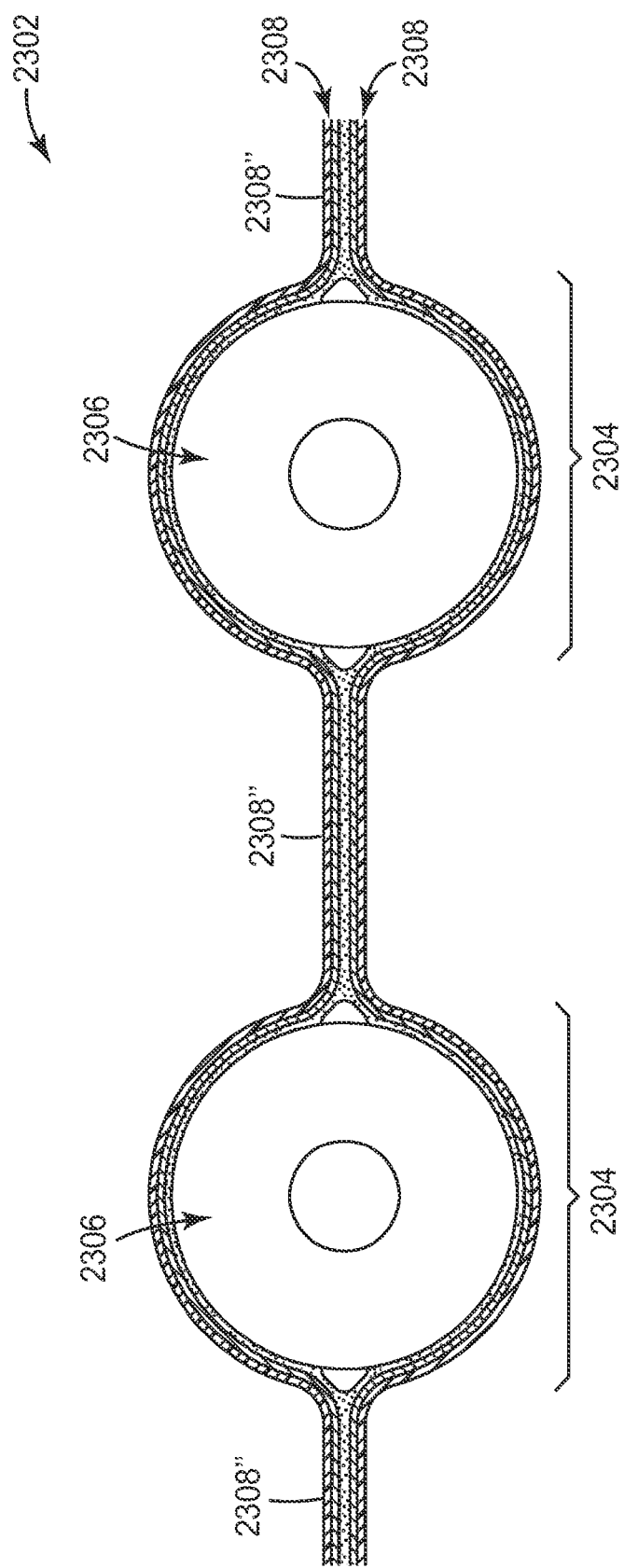

In FIG. 15b, shielded electrical cable 2302 includes two conductor sets 2304, each including one longitudinal insulated conductor 2306, and two generally parallel shielding films 2308 disposed around conductor sets 2304. Shielding films 2308 include parallel portions 2308" wherein shielding films 2308 are substantially parallel. Parallel portions 2308" positioned in between conductor sets 2304 are configured to electrically isolate conductor sets 2304 from each other. In shielded electrical cable 2302, parallel portions 2308" of shielding films 2308 and insulated conductors 2306 are arranged generally in a single plane.

Figure 15C:
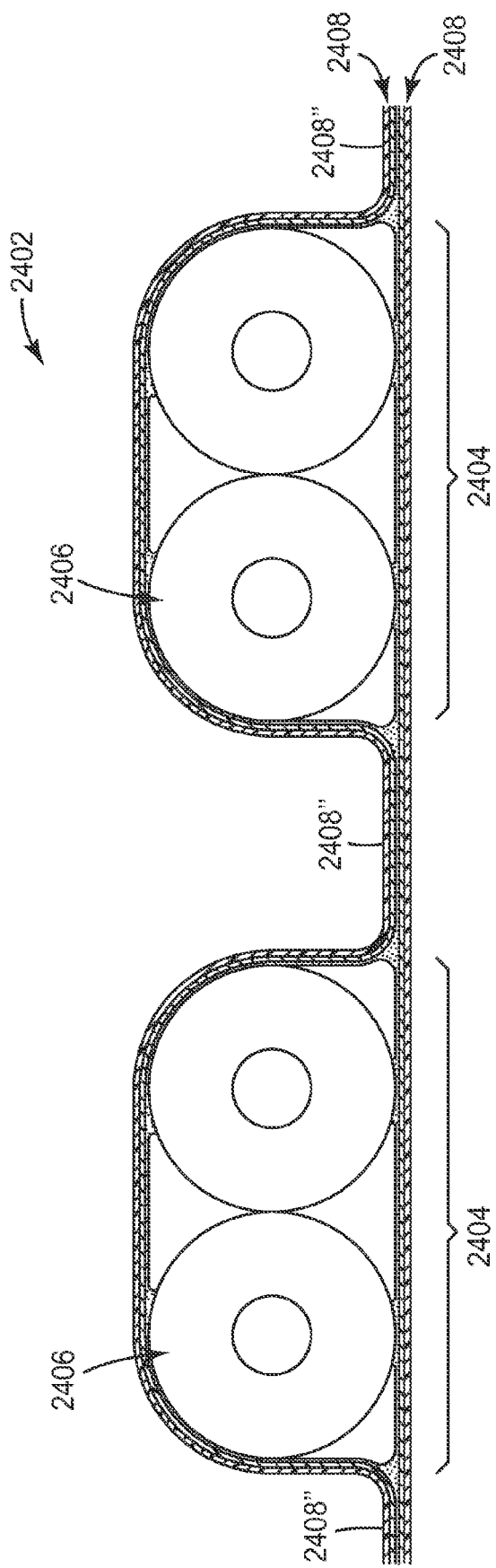

In FIG. 15c, shielded electrical cable 2402 includes two conductor sets 2404, each including two substantially parallel longitudinal insulated conductors 2406, and two generally parallel shielding films 2408 disposed around conductor sets 2404. Shielding films 2408 include parallel portions 2408" wherein shielding films 2408 are substantially parallel. Parallel portions 2408" positioned in between conductor sets 2404 are configured to electrically isolate conductor sets 2404 from each other. In shielded electrical cable 2402, parallel portions 2408" of shielding films 2408 and insulated conductors 2406 are arranged in different planes.

Figure 16A:
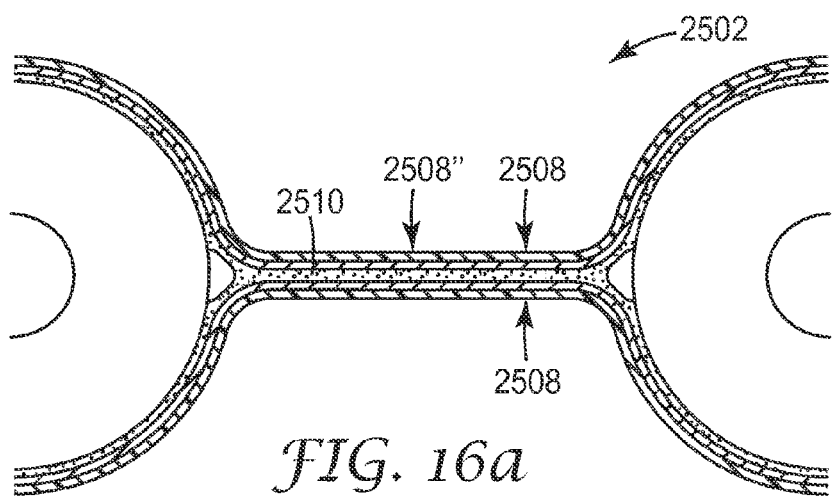
FIGS. 16a-16g are front cross-sectional detail views illustrating seven exemplary embodiments of a parallel portion of a shielded electrical cable according to aspects of the present invention.

In FIG. 16a, shielded electrical cable 2502 includes a parallel portion 2508" wherein shielding films 2508 are spaced apart. Spacing apart shielding films 2508, i.e., not having shielding films 2508 make direct electrical contact continuously along their seam, increases the strength of parallel portion 2508". This is an advantage over shielded electrical cables wherein relatively thin and fragile shielding films may fracture or crack during manufacturing if forced to make direct electrical contact continuously along their seam. Spacing apart shielding films 2508 may permit crosstalk between adjacent conductor sets if effective means are not used to reduce the crosstalk potential. Generally, the electrical and magnetic fields must be contained to the general area of the conductor sets and not permitted to impinge on an adjacent conductor set. In the embodiment illustrated in FIG. 16a, this is achieved by providing a low characteristic impedance between shielding films 2508. This may be accomplished by spacing apart shielding films 2508 at close proximity. In one embodiment, shielding films 2508 are spaced apart by less than about 0.13 mm in at least one location of parallel portion 2508". The resulting characteristic impedance between shielding films 2508 may be less than about 15 Ohms, and the resulting crosstalk between adjacent conductor sets may be less than about −25 dB. In one embodiment, parallel portion 2508" has a minimum thickness of less than about 0.13 mm. In one embodiment, shielding films 2508 are spaced apart by a separation medium. The separation medium may include conformable adhesive layer 2510. In one embodiment, the separation medium has a dielectric constant of at least 1.5. A high dielectric constant decreases the characteristic impedance between shielding films 2508, thereby decreasing the crosstalk (increasing the electrical isolation) between adjacent conductor sets. Shielding films 2508 may make direct electrical contact with each other in at least one location of parallel portion 2508". Shielding films 2508 may be forced together in selective locations as suitable for the intended application such that conformable adhesive layer 2510 conforms around these locations. This can be done, e.g., with a patterned tool making intermittent pinch contact between shielding films 2508 in these locations. These locations may be patterned longitudinally or transversely. In one embodiment, the separation medium may be electrically conductive to enable direct electrical contact between shielding films 2508.

Figure 16B:
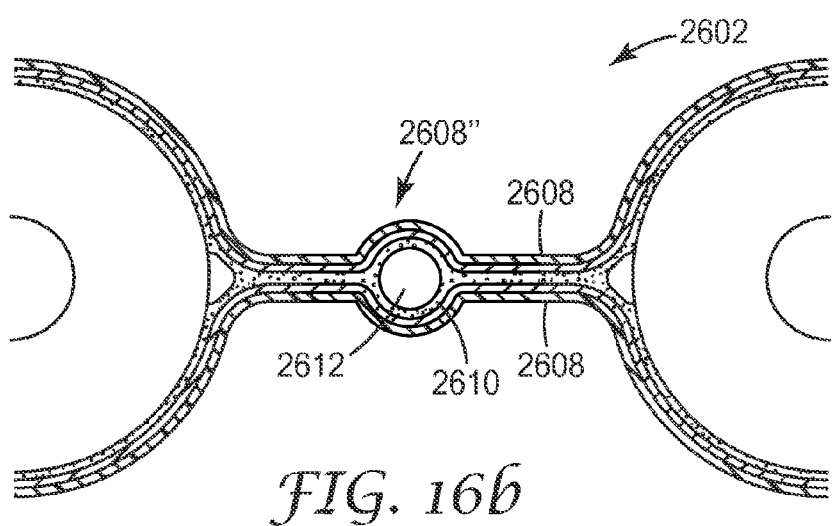

In FIG. 16b, shielded electrical cable 2602 includes a parallel portion 2608" including a longitudinal ground conductor 2612 disposed between shielding films 2608. Ground conductor 2612 makes indirect electrical contact with both shielding films 2608. Ground conductor 2612 has a low but non-zero impedance with respect to shielding films 2608. In other embodiments, ground conductor 2612 may make direct or indirect electrical contact with at least one of the shielding films 2608 in at least one location of parallel portion 2608". In one embodiment, shielded electrical cable 2602 includes a conformable adhesive layer 2610 disposed between shielding films 2608 and configured to provide controlled separation of at least one of shielding films 2608 and ground conductor 2612. In one aspect, this means that conformable adhesive layer 2610 has a non-uniform thickness that allows ground conductor 2612 to make direct or indirect electrical contact with at least one of shielding films 2608 in selective locations as suitable for the intended application. In one embodiment, ground conductor 2612 may include surface asperities or a deformable wire, such as, e.g., a stranded wire, to provide this controlled electrical contact between ground conductor 2612 and at least one of shielding films 2608.

Figure 16C:
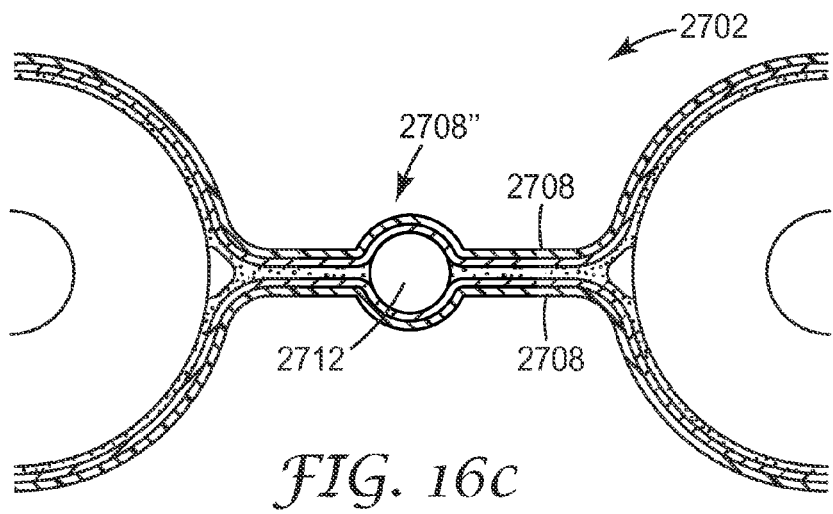

In FIG. 16c, shielded electrical cable 2702 includes a parallel portion 2708" including a longitudinal ground conductor 2712 disposed between shielding films 2708. Ground conductor 2712 makes direct electrical contact with both shielding films 2708.

Figure 16D:
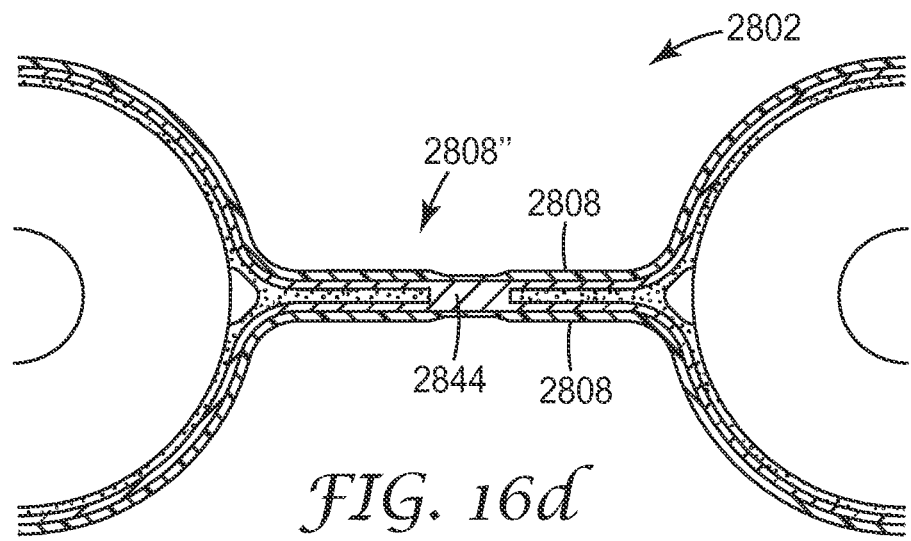

In FIG. 16d, shielded electrical cable 2802 includes a parallel portion 2808" wherein shielding films 2808 make direct electrical contact with each other by any suitable means, such as, e.g., conductive element 2844. Conductive element 2844 may include a conductive plated via or channel, a conductive filled via or channel, or a conductive adhesive, to name a few.

Figure 16E:
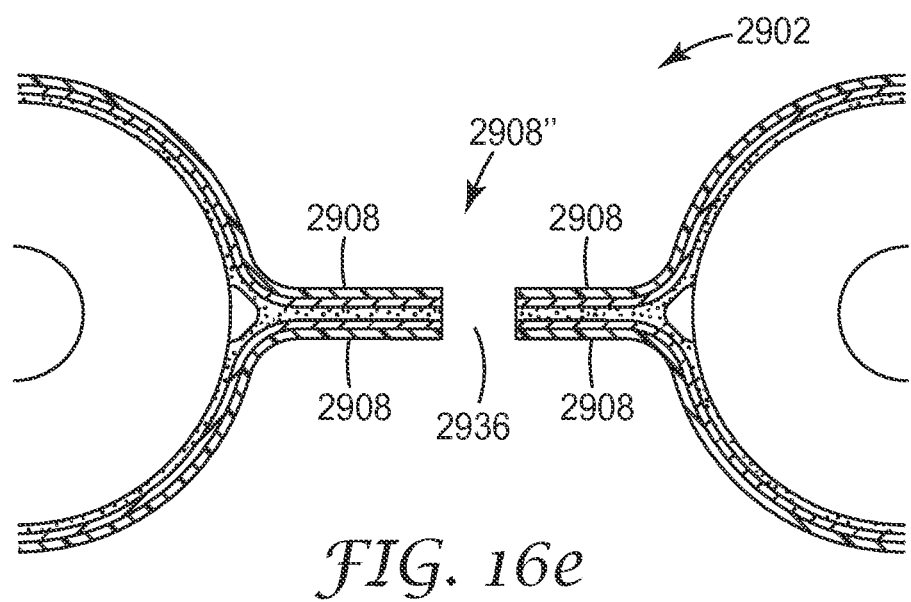

In FIG. 16e, shielded electrical cable 2902 includes a parallel portion 2908" including an opening 2936 in at least one location of parallel portion 2908". In other words, parallel portion 2908" is discontinuous. Opening 2936 may include a hole, a perforation, a slit, and any other suitable element. Opening 2936 provides at least some level of physical separation, which contributes to the electrical isolation performance of parallel portion 2908" and increases at least the lateral flexibility of shielded electrical cable 2902. This separation may be discontinuous along the length of parallel portion 2908", and may be discontinuous across the width of parallel portion 2908".

Figure 16F:
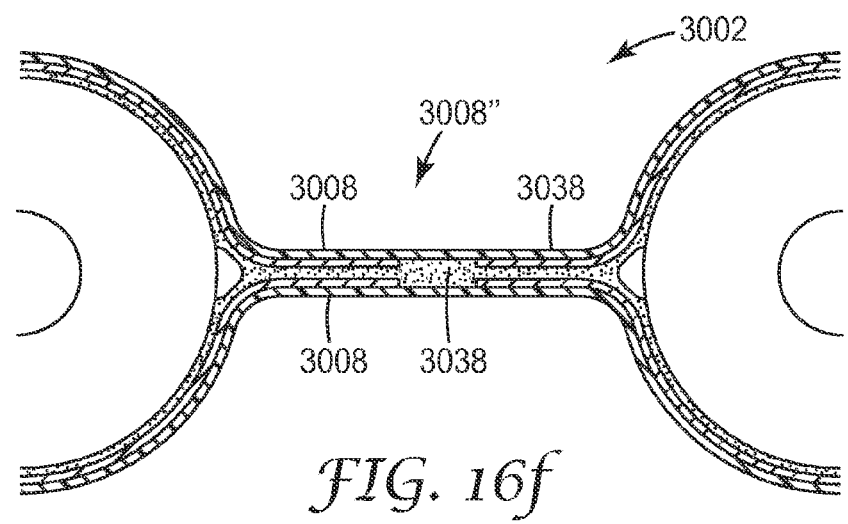

In FIG. 16f, shielded electrical cable 3002 includes a parallel portion 3008" wherein at least one of shielding films 3008 includes a break 3038 in at least one location of parallel portion 3008". In other words, at least one of shielding films 3008 is discontinuous. Break 3038 may include a hole, a perforation, a slit, and any other suitable element. Break 3038 provides at least some level of physical separation, which contributes to the electrical isolation performance of parallel portion 3008" and increases at least the lateral flexibility of shielded electrical cable 3002. This separation may be discontinuous or continuous along the length of parallel portion 3008", and may be discontinuous across the width of parallel portion 3008".

Figure 16G:
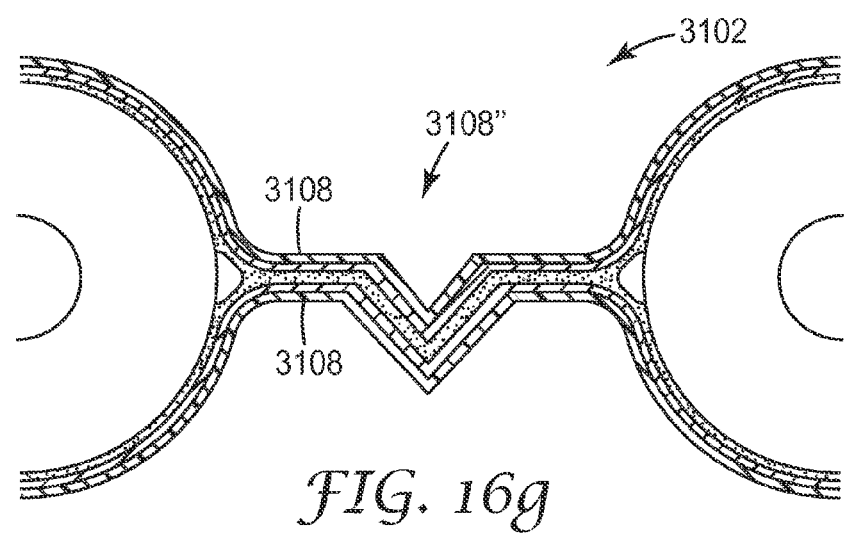

In FIG. 16g, shielded electrical cable 3102 includes a parallel portion 3108" that is piecewise planar in a folded configuration. All other things being equal, a piecewise planar parallel portion has a greater actual width than a planar parallel portion having the same projected width. If the actual width of a parallel portion is much greater than the spacing between the shielding films, a low characteristic impedance results, which contributes to the electrical isolation performance of the parallel portion. In one embodiment, a characteristic impedance of less than 5 to 10 Ohms results in good electrical isolation. In one embodiment, parallel portion 3108" of shielded electrical cable 3102 has an actual width to minimum spacing ratio of at least 5. In one embodiment, parallel portion 3108" is pre-bent and thereby increases at least the lateral flexibility of shielded electrical cable 3102. Parallel portion 3108" may be piecewise planar in any other suitable configuration.

Figure 17A:
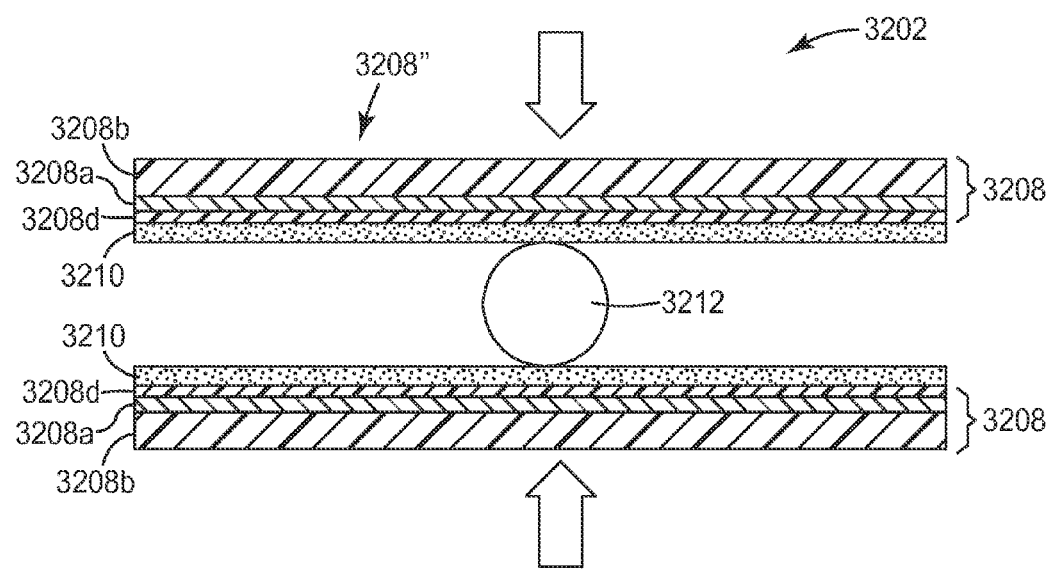
FIGS. 17a-17b are front cross-sectional detail views of another exemplary embodiment of a parallel portion of a shielded electrical cable according to an aspect of the present invention.
Figure 17B:
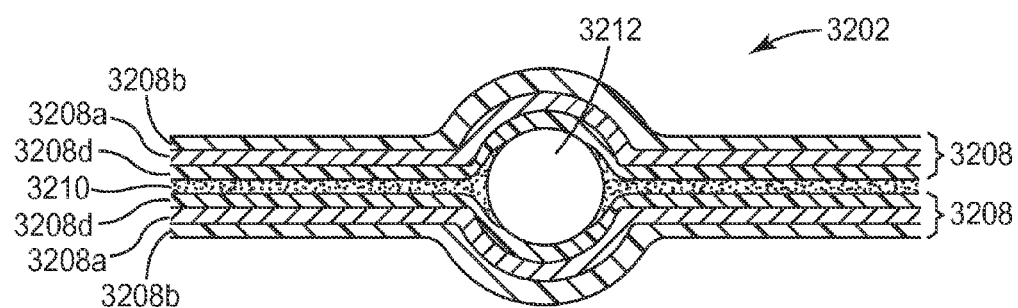

Referring now to FIGS. 17a-17b, another exemplary embodiment of a parallel portion of a shielded electrical cable according to an aspect of the present invention is illustrated. Shielded electrical cable 3202 includes two generally parallel shielding films 3208 include a parallel portion 3208" wherein shielding films 3208 are substantially parallel. Shielding films 3208 include a non-conductive polymeric layer 3208b, a conductive layer 3208a disposed on non-conductive polymeric layer 3208b, and a stop layer 3208d disposed on conductive layer 3208a. A conformable adhesive layer 3210 is disposed on stop layer 3208d. Parallel portion 3208" includes a longitudinal ground conductor 3212 disposed between shielding films 3208. Ground conductor 3212 makes indirect electrical contact with conductive layers 3208a of shielding films 3208. This indirect electrical contact is enabled by a controlled separation of conductive layer 3208a and ground conductor 3212 provided by stop layer 3208d. In one embodiment, stop layer 3208d is a non-conductive polymeric layer. As shown in FIGS. 17a-17b, an external pressure (FIG. 17a) is used to press conductive layers 3208a together and force conformable adhesive layers 3210 to conform around ground conductor 3212 (FIG. 17b). Because stop layer 3208d does not conform at least under the same conditions, it prevents direct electrical contact between ground conductor 3212 and conductive layer 3208a of shielding films 3208. The thickness and dielectric properties of stop layer 3208d may be selected to achieve a target characteristic impedance. In one embodiment, a characteristic impedance of less than 5 to 10 Ohms results in good electrical isolation.

Figure 18:
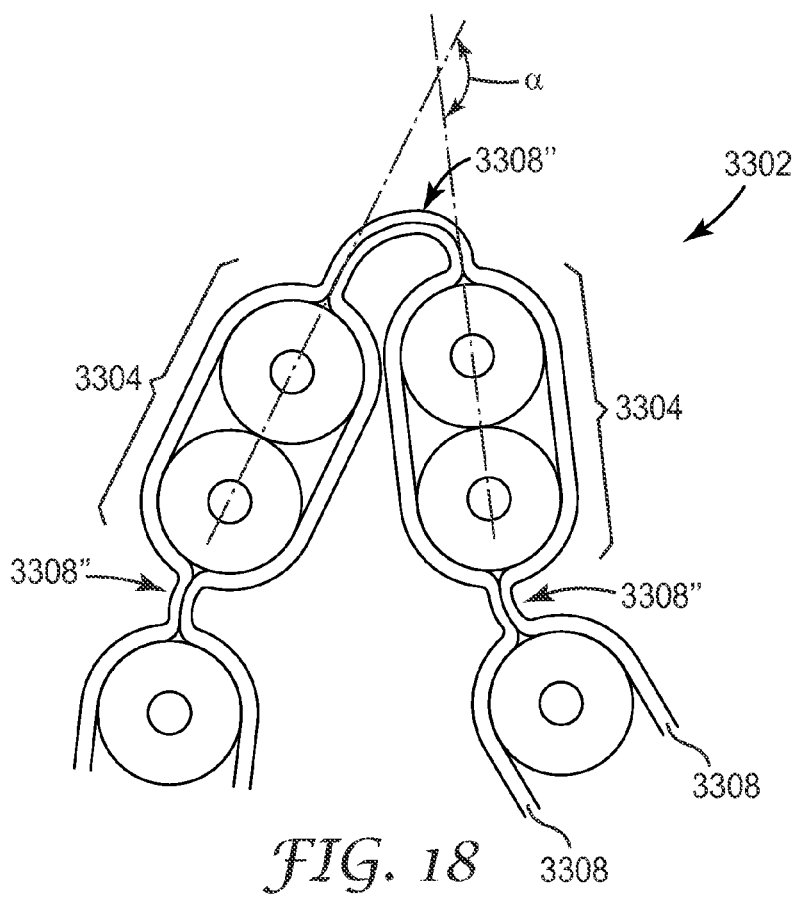
FIG. 18 is a front cross-sectional detail view of another exemplary embodiment of a shielded electrical cable according to an aspect of the present invention in a bent configuration.

FIG. 18 illustrates another exemplary embodiment of a shielded electrical cable according to an aspect of the present invention. Shielded electrical cable 3302 includes two generally parallel shielding films 3308 disposed around spaced apart conductor sets 3304. Shielding films 3308 include parallel portions 3308" wherein shielding films 3308 are substantially parallel. Parallel portions 3308" are configured to be laterally bent at an angle α of at least 30°. This lateral flexibility of parallel portions 3308" enables shielded electrical cable 3302 to be folded in any suitable configuration, such as, e.g., a configuration that can be used in a round cable (see, e.g., FIG. 10g). In one embodiment, the lateral flexibility of parallel portions 3308" is enabled by shielding films 3308 including two or more relatively thin individual layers. To warrant the integrity of these individual layers in particular under bending conditions, it is preferred that the bonds between them remain intact. In one embodiment, parallel portions 3308" have a minimum thickness of less than about 0.13 mm, and the bond strength between individual layers is at least 17.86 g/mm (1 lbs/inch) after thermal exposures during processing or use.

In one aspect, it is beneficial to the electrical performance of a shielded electrical cable according to aspect of the present invention for the parallel portions to have approximately the same size and shape on both sides of a conductor set. Any dimensional changes or imbalances may produce imbalances in capacitance and inductance along the length of the parallel portion. This in turn may cause impedance differences along the length of the parallel portion and impedance imbalances between adjacent conductor sets. At least for these reasons, control of the spacing between the shielding films may be desired. In one embodiment, the shielding films on both sides of a conductor set are spaced apart within about 0.05 mm of each other.

Figure 19:
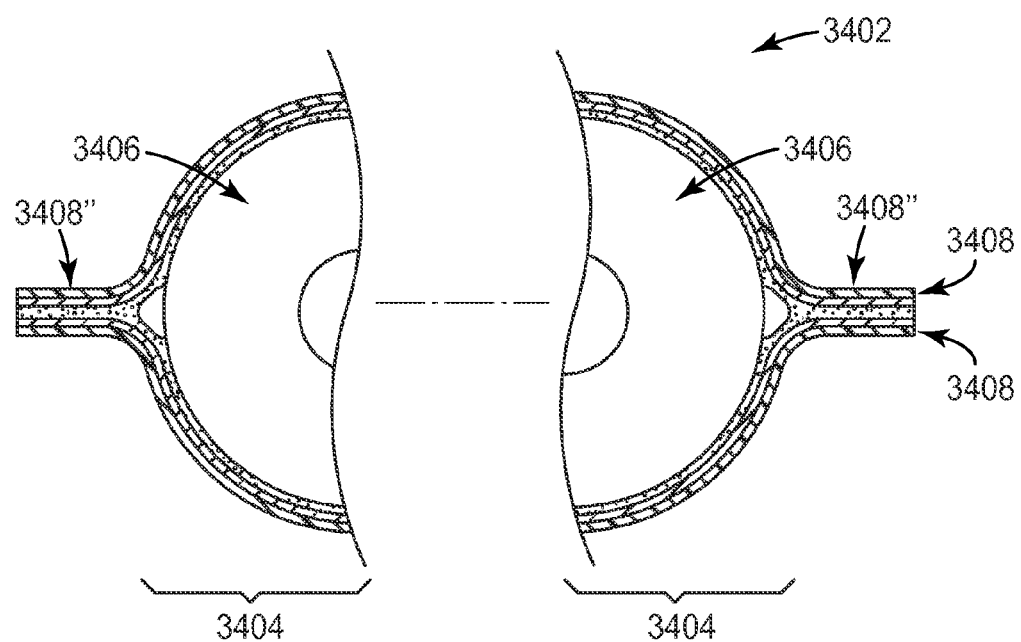
FIG. 19 is a front cross-sectional detail view of another exemplary embodiment of a shielded electrical cable according to an aspect of the present invention.

In FIG. 19, shielded electrical cable 3402 includes two conductor sets 3404, each including two substantially parallel longitudinal insulated conductors 3406, and two generally parallel shielding films 3408 disposed around conductor sets 3404. Shielding films 3408 include parallel portions 3408" wherein shielding films 3408 are substantially parallel. Parallel portions 3408" positioned at or near an edge of shielded electrical cable 3402 are configured to electrically isolate conductor sets 3404 from the external environment. In shielded electrical cable 3402, parallel portions 3408" of shielding films 3408 and insulated conductors 3406 are arranged generally in a single plane.

Figure 20A:
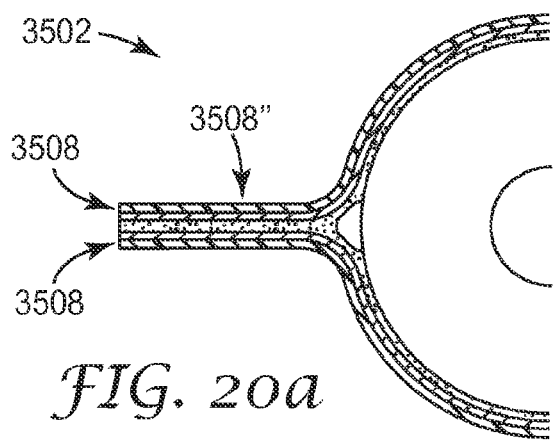
FIGS. 20a-20f are front cross-sectional detail views illustrating six other exemplary embodiments of a parallel portion of a shielded electrical cable according to aspects of the present invention.

In FIG. 20a, shielded electrical cable 3502 includes a parallel portion 3508" wherein shielding films 3508 are spaced apart. Parallel portion 3508" is similar to parallel portion 2508" described above and illustrated in FIG. 16a. Whereas parallel portion 2508" is positioned in between conductor sets, parallel portion 3508" is positioned at or near an edge of shielded electrical cable 3502.

Figure 20B:
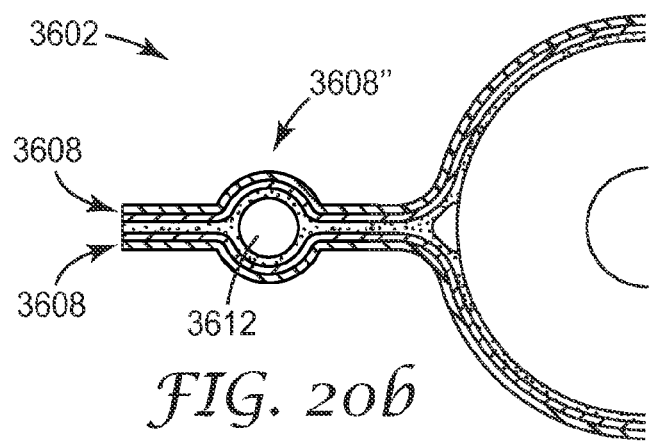

In FIG. 20b, shielded electrical cable 3602 includes a parallel portion 3608" including a longitudinal ground conductor 3612 disposed between shielding films 3608. Parallel portion 3608" is similar to parallel portion 2608" described above and illustrated in FIG. 16b. Whereas parallel portion 2608" is positioned in between conductor sets, parallel portion 3608" is positioned at or near an edge of shielded electrical cable 3602.

Figure 20C:
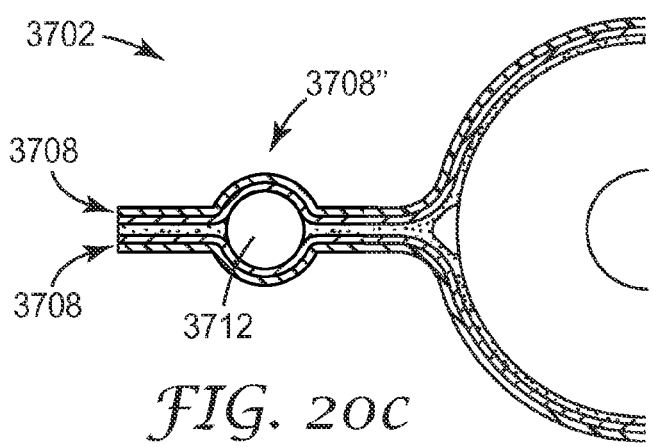

In FIG. 20c, shielded electrical cable 3702 includes a parallel portion 3708" including a longitudinal ground conductor 3712 disposed between shielding films 3708. Parallel portion 3708" is similar to parallel portion 2708" described above and illustrated in FIG. 16c. Whereas parallel portion 2708" is positioned in between conductor sets, parallel portion 3708" is positioned at or near an edge of shielded electrical cable 3702.

Figure 20D:
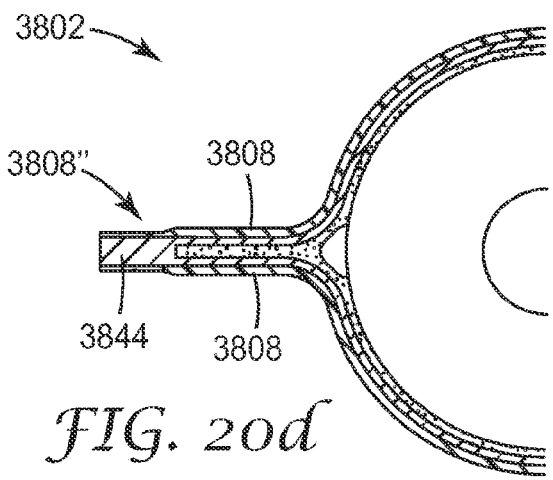

In FIG. 20d, shielded electrical cable 3802 includes a parallel portion 3808" wherein shielding films 3808 make direct electrical contact with each other by any suitable means, such as, e.g., conductive element 3844. Conductive element 3844 may include a conductive plated via or channel, a conductive filled via or channel, or a conductive adhesive, to name a few. Parallel portion 3808" is similar to parallel portion 2808" described above and illustrated in FIG. 16d. Whereas parallel portion 2808" is positioned in between conductor sets, parallel portion 3808" is positioned at or near an edge of shielded electrical cable 3802.

Figure 20E:
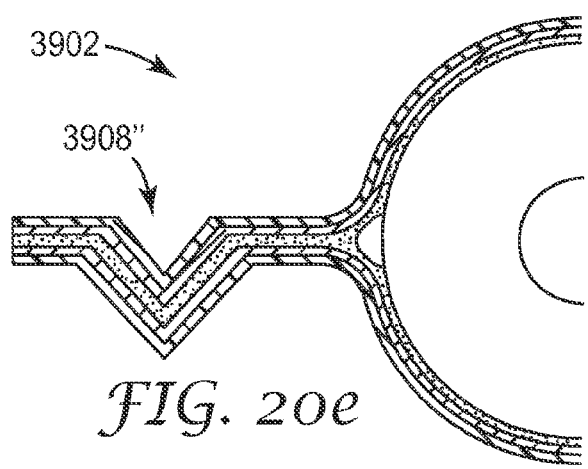

In FIG. 20e, shielded electrical cable 3902 includes a parallel portion 3908" that is piecewise planar in a folded configuration. Parallel portion 3908" is similar to parallel portion 3108" described above and illustrated in FIG. 16g. Whereas parallel portion 3108" is positioned in between conductor sets, parallel portion 3908" is positioned at or near an edge of shielded electrical cable 3902.

Figure 20F:
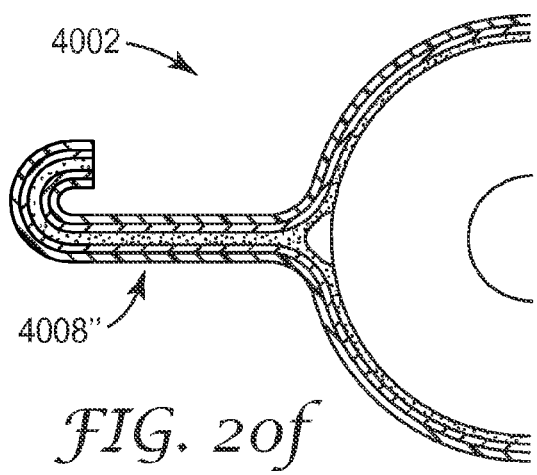

In FIG. 20f, shielded electrical cable 4002 includes a parallel portion 4008" that is piecewise planar in a curved configuration and positioned at or near an edge of shielded electrical cable 4002.

Figure 21A:
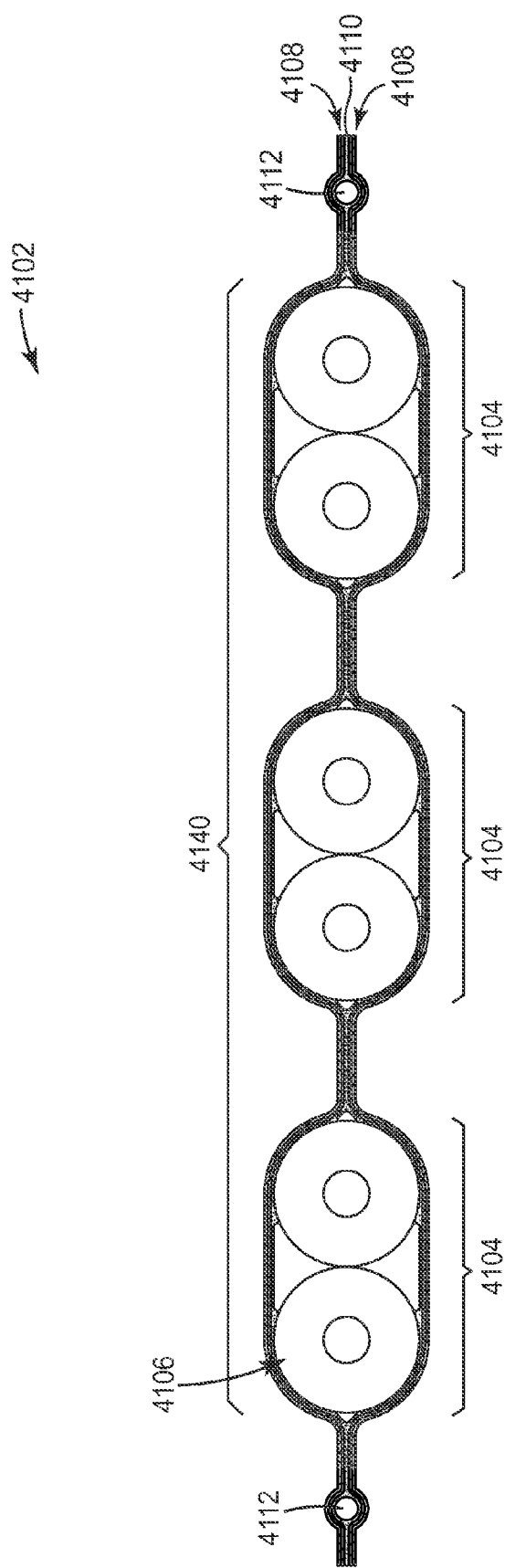
FIG. 21a-21b are front cross-sectional views of two other exemplary embodiments of a shielded electrical cable according to aspects of the present invention.
Figure 21B:
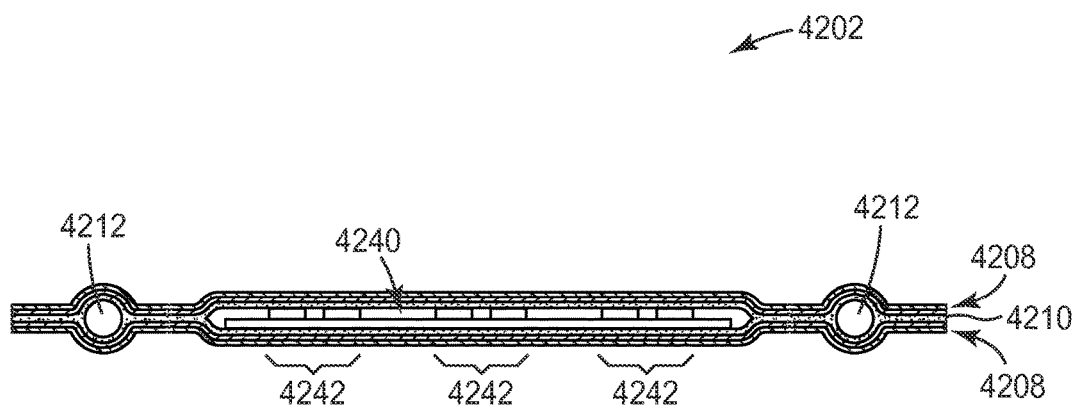

A shielded electrical cable according to an aspect of the present invention may include at least one longitudinal ground conductor, an electrical article extending in substantially the same direction as the ground conductor, and two generally parallel shielding films disposed around the ground conductor and the electrical article. In this configuration, the shielding films and ground conductor are configured to electrically isolate the electrical article. The ground conductor may extend beyond at least one of the ends of the shielding films, e.g., for termination of the shielding films to any suitable individual contact element of any suitable termination point, such as, e.g., a contact element on a printed circuit board or an electrical contact of an electrical connector. Beneficially, only a limited number of ground conductors is needed for a cable construction, and can, along with the shielding films, complete an electromagnetic enclosure of the electrical article. The electrical article may include at least one longitudinal conductor, at least one conductor set including one or more substantially parallel longitudinal insulated conductors, a flexible printed circuit, or any other suitable electrical article of which electrical isolation is desired. FIGS. 21a-21b illustrate two exemplary embodiments of such shielded electrical cable configuration.

In FIG. 21a, shielded electrical cable 4102 includes two spaced apart substantially parallel longitudinal ground conductors 4112, an electrical article 4140 positioned between and extending in substantially the same direction as ground conductors 4112, and two generally parallel shielding films 4108 disposed around ground conductors 4112 and electrical article 4140. Electrical article 4140 includes three conductor sets 4104. Each conductor set 4104 includes two substantially parallel longitudinal insulated conductors 4106. Ground conductors 4112 make indirect electrical contact with both shielding films 4108. Ground conductors 4112 have a low but non-zero impedance with respect to shielding films 4108. In other embodiments, ground conductors 4112 may make direct or indirect electrical contact with at least one of the shielding films 4108 in at least one location of shielding films 4108. In one embodiment, shielded electrical cable 4102 includes a conformable adhesive layer 4110 disposed between shielding films 4108 and bonding shielding films 4108 to each other on both sides of ground conductors 4112 and electrical article 4140. Conformable adhesive layer 4110 is configured to provide controlled separation of at least one of shielding films 4108 and ground conductors 4112. In one aspect, this means that conformable adhesive layer 4110 has a non-uniform thickness that allows ground conductors 4112 to make direct or indirect electrical contact with at least one of shielding films 4108 in selective locations as suitable for the intended application. In one embodiment, ground conductors 4112 may include surface asperities or a deformable wire, such as, e.g., a stranded wire, to provide this controlled electrical contact between ground conductors 4112 and at least one of shielding films

4108. In one embodiment, shielding films 4108 are spaced apart by a minimum spacing in at least one location of shielding films 4108, and ground conductors 4112 have a thickness that is greater than the minimum spacing. In one embodiment, shielding films 4108 have a thickness of less than about 0.025 mm.

In FIG. 21*b*, shielded electrical cable 4202 includes two spaced apart substantially parallel longitudinal ground conductors 4212, an electrical article 4240 positioned between and extending in substantially the same direction as ground conductors 4212, and two generally parallel shielding films 4208 disposed around ground conductors 4212 and electrical article 4240. Shielded electrical cable 4202 is similar to shielded electrical cable 4102 described above and illustrated in FIG. 21*a*. Whereas in shielded electrical cable 4102, electrical article 4140 includes three conductor sets 4104 each including two substantially parallel longitudinal insulated conductors 4106, in shielded electrical cable 4202, electrical article 4240 includes a flexible printed circuit including three conductor sets 4242.

Figure 22:
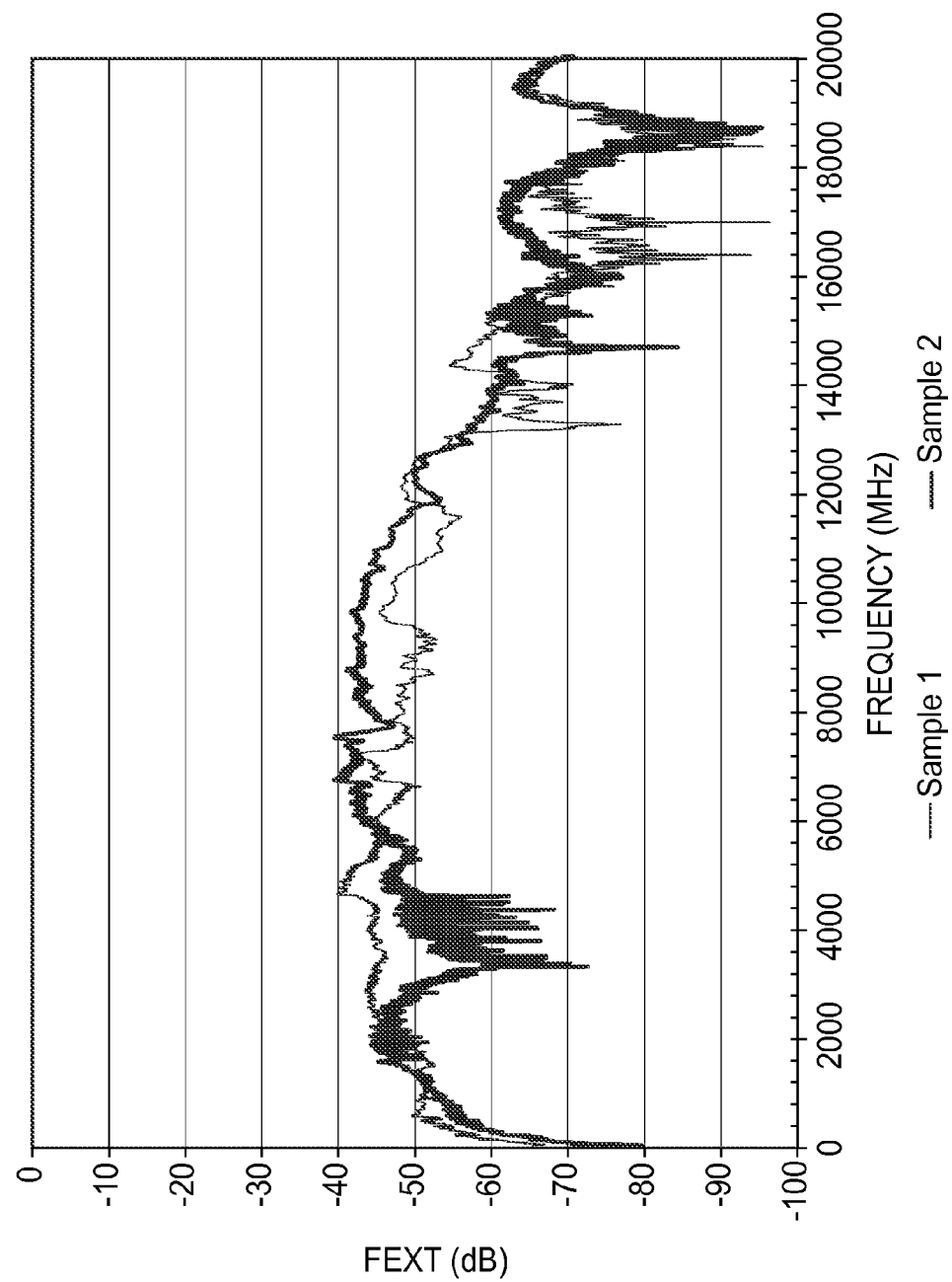
FIG. 22 is a graph comparing the electrical isolation performance of an exemplary embodiment of a shielded electrical cable according to an aspect of the present invention to the electrical isolation performance of a conventional electrical cable.

FIG. 22 illustrates the far end crosstalk (FEXT) isolation between two adjacent conductor sets of a conventional electrical cable wherein the conductor sets are completely isolated, i.e., have no common ground (Sample 1), and between two adjacent conductor sets of shielded electrical cable 2202 illustrated in FIG. 15*a* wherein shielding films 2208 are spaced apart by about 0.025 mm (Sample 2), both having a cable length of about 3 m. The test method for creating this data is well known in the art. The data was generated using an Agilent 8720ES 50 MHz-20 GHz S-Parameter Network Analyzer. It can be seen by comparing the far end crosstalk plots that the conventional electrical cable and shielded electrical cable 2202 provide a similar far end crosstalk performance. Specifically, it is generally accepted that a far end crosstalk of less than about −35 dB is suitable for most applications. It can be easily seen from FIG. 22 that for the configuration tested, both the conventional electrical cable and shielded electrical cable 2202 provide satisfactory electrical isolation performance. The satisfactory electrical isolation performance in combination with the increased strength of the parallel portion due to the ability to space apart the shielding films is an advantage of a shielded electrical cable according to an aspect of the present invention over conventional electrical cables.

The following items are exemplary embodiments of a shielded electrical cable according to aspects of the present invention.

Item 1 is a shielded electrical cable comprising a conductor set including one or more substantially parallel longitudinal insulated conductors; and two generally parallel shielding films disposed around the conductor set and including a parallel portion wherein the shielding films are substantially parallel, wherein the parallel portion is configured to electrically isolate the conductor set.

Item 2 is a shielded electrical cable comprising at least two spaced apart conductor sets arranged generally in a single plane, each conductor set including one or more substantially parallel longitudinal insulated conductors; and two generally parallel shielding films disposed around the conductor sets and including a parallel portion wherein the shielding films are substantially parallel, wherein the parallel portion is configured to electrically isolate adjacent conductor sets from each other.

Item 3 is the shielded electrical cable of item 1 or item 2, wherein the shielding films are spaced apart in the parallel portion.

Item 4 is the shielded electrical cable of item 3, wherein the shielding films are spaced apart by less than about 0.13 mm in at least one location of the parallel portion.

Item 5 is the shielded electrical cable of item 1 or item 2, wherein the parallel portion has a minimum thickness of less than about 0.13 mm.

Item 6 is the shielded electrical cable of item 1 or item 2, wherein the parallel portion is configured to be laterally bent at an angle of at least 30°.

Item 7 is the shielded electrical cable of item 1 or item 2, wherein the parallel portion has an actual width to minimum spacing ratio of at least 5.

Item 8 is the shielded electrical cable of item 1 or item 2, wherein the parallel portion is piecewise planar.

Item 9 is the shielded electrical cable of item 3, wherein the shielding films are spaced apart by a separation medium having a dielectric constant of at least 1.5.

Item 10 is the shielded electrical cable of item 3, wherein the shielding films are spaced apart by an electrically conductive separation medium.

Item 11 is the shielded electrical cable of item 1 or item 2, wherein the parallel portion includes a longitudinal ground conductor disposed between the shielding films.

Item 12 is the shielded electrical cable of item 11, wherein the ground conductor makes direct electrical contact with at least one of the shielding films in at least one location of the parallel portion.

Item 13 is the shielded electrical cable of item 11, wherein the ground conductor makes indirect electrical contact with at least one of the shielding films in at least one location of the parallel portion.

Item 14 is the shielded electrical cable of item 11, wherein the shielded electrical cable further comprises a conformable adhesive layer disposed between the shielding films and configured to provide controlled separation of at least one of the shielding films and the ground conductor.

Item 15 is the shielded electrical cable of item 14, wherein at least one of the shielding films includes a conductive layer and a stop layer, and wherein the stop layer is configured to provide controlled separation of the conductive layer and the ground conductor.

Item 16 is the shielded electrical cable of item 1 or item 2, wherein the shielding films make direct electrical contact with each other in at least one location of the parallel portion.

Item 17 is the shielded electrical cable of item 1 or item 2, wherein the parallel portion includes an opening in at least one location of the parallel portion.

Item 18 is the shielded electrical cable of item 1 or item 2, wherein at least one of the shielding films includes a break in at least one location of the parallel portion.

Item 19 is the shielded electrical cable of item 1 or item 2, wherein the shielding films on both sides of a conductor set are spaced apart within about 0.05 mm of each other.

Item 20 is a shielded electrical cable comprising at least one longitudinal ground conductor; an electrical article extending in substantially the same direction as the ground conductor; and two generally parallel shielding films disposed around the ground conductor and the electrical article.

Item 21 is the shielded electrical cable of item 20 further comprising a conformable adhesive layer disposed between the shielding films and bonding the shielding films to each other on both sides of the ground conductor and the electrical article.

Item 22 is the shielded electrical cable of item 20, wherein the electrical article includes at least one longitudinal conductor.

Item 23 is the shielded electrical cable of item 20, wherein the electrical article includes at least one conductor set including one or more substantially parallel longitudinal insulated conductors.

Item 24 is the shielded electrical cable of item 20, wherein the electrical article includes a flexible printed circuit.

Item 25 is the shielded electrical cable of item 20, wherein the ground conductor makes direct electrical contact with at least one of the shielding films.

Item 26 is the shielded electrical cable of item 20, wherein the ground conductor makes indirect electrical contact with at least one of the shielding films.

Item 27 is the shielded electrical cable of item 25 or item 26, wherein the shielded electrical cable further comprises a conformable adhesive layer disposed between the shielding films and configured to provide controlled separation of at least one of the shielding films and the ground conductor.

Item 28 is the shielded electrical cable of item 25 or item 26, wherein the shielding films are spaced apart by a minimum spacing in at least one location of the shielding films, and wherein the ground conductor has a thickness that is greater than the minimum spacing.

Item 29 is the shielded electrical cable of item 25 or item 26, wherein the shielding films have a thickness of less than about 0.025 mm.

Item 30 is the shielded electrical cable of item 25 or item 26, wherein the ground conductor includes surface asperities configured to provide controlled electrical contact between the ground conductor and at least one of the shielding films.

Item 31 is the shielded electrical cable of item 25 or item 26, wherein the ground conductor extends beyond at least one of the ends of the shielding films.

Item 32 is a shielded electrical cable comprising two spaced apart substantially parallel longitudinal ground conductors; an electrical article positioned between and extending in substantially the same direction as the ground conductors; and two generally parallel shielding films disposed around the ground conductors and the electrical article.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A shielded electrical cable comprising:
   a conductor set including one or more substantially parallel longitudinal insulated conductors; and
   two generally parallel shielding films disposed around the conductor set, each shielding film including a parallel portion on each lateral side of the conductor set, wherein the parallel portions of the shielding films on each lateral side of the conductor set are substantially parallel to one other and bonded to each other by an adhesive layer disposed therebetween, and wherein the bonded parallel portions of the shielding films on at least one lateral side of the conductor set are folded and piecewise planar.

2. The cable of claim 1, wherein the conductor set includes two or more substantially parallel longitudinal insulated conductors.

3. The cable of claim 1, wherein the parallel portions of the shielding films on each lateral side of the conductor set are spaced apart.

4. The cable of claim 1, wherein the parallel portions of the shielding films on at least one lateral side of the conductor set make direct electrical contact with each other.

5. The cable of claim 1, wherein the parallel portions of the shielding films on at least one lateral side of the conductor include openings.

6. The cable of claim 1, wherein the parallel portions of the shielding films on each lateral side of the conductor set are spaced apart within about 0.05 mm of each other.

7. A shielded electrical cable comprising:
   two spaced apart conductor sets arranged generally in a single plane, each conductor set including one or more substantially parallel longitudinal insulated conductors; and
   two generally parallel shielding films disposed around the conductor sets, each shielding film including a parallel portion between the two conductor sets, wherein the parallel portions of the shielding films are substantially parallel to one another, bonded to each other by an adhesive layer disposed therebetween, and the bonded parallel portions are folded and piecewise planar, and wherein the parallel portions electrically isolate the two conductor sets from each other.

8. The cable of claim 7, wherein each conductor set includes two or more substantially parallel longitudinal insulated conductors.

9. The cable of claim 7, wherein the parallel portion of each shielding film has an actual width to projected width ratio of at least 5.

* * * * *